United States Patent
Lin et al.

(10) Patent No.: US 10,734,411 B2
(45) Date of Patent: Aug. 4, 2020

(54) SYSTEMS AND METHODS FOR A SEMICONDUCTOR STRUCTURE HAVING MULTIPLE SEMICONDUCTOR-DEVICE LAYERS

(71) Applicant: Taiwan Semiconductor Manufacturing Company, Ltd., Hsinchu (TW)

(72) Inventors: Yi-Tang Lin, Hsinchu (TW); Chun-Hsiung Tsai, Xinpu Township (TW); Clement Hsingjen Wann, Carmel, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/051,280

(22) Filed: Jul. 31, 2018

(65) Prior Publication Data

US 2018/0337198 A1    Nov. 22, 2018

Related U.S. Application Data

(62) Division of application No. 14/074,932, filed on Nov. 8, 2013, now Pat. No. 10,128,269.

(51) Int. Cl.
*H01L 27/12* (2006.01)
*H01L 27/092* (2006.01)
(Continued)

(52) U.S. Cl.
CPC .... *H01L 27/1207* (2013.01); *H01L 21/76254* (2013.01); *H01L 21/823807* (2013.01);
(Continued)

(58) Field of Classification Search
CPC .......... H01L 27/0886; H01L 27/0922; H01L 27/0924; H01L 29/785; H01L 29/66795;
(Continued)

(56) References Cited

U.S. PATENT DOCUMENTS 6,737,332 B1    5/2004   Fuselier et al.
7,468,313 B2   12/2008   Thean et al.
(Continued)

FOREIGN PATENT DOCUMENTS

CN        1954410 A      4/2007
KR     20040102052 A    12/2004
(Continued)

OTHER PUBLICATIONS

Chinese Office Action, Application No. 201410403874.1; dated Mar. 2, 2017.
(Continued)

*Primary Examiner* — Sue A Purvis
*Assistant Examiner* — Scott Stowe
(74) *Attorney, Agent, or Firm* — Slater Matsil, LLP

(57) ABSTRACT

A method of fabricating a semiconductor structure having multiple semiconductor device layers is provided. The method comprises providing a bulk substrate and growing a first channel material on the bulk substrate wherein the lattice constant of the first channel material is different from the lattice constant of the bulk substrate to introduce strain to the first channel material. The method further comprises fabricating a first semiconductor device layer on the bulk substrate with the strained first channel material, fabricating a buffer layer comprising dielectric material with a blanket top surface above the first semiconductor layer, bonding to the blanket top surface a bottom surface of a second substrate comprising a buried oxide with a second channel
(Continued)

material above the buried oxide, and fabricating a second semiconductor device layer on the second substrate.

20 Claims, 32 Drawing Sheets

(51) Int. Cl.
    *H01L 21/8238*     (2006.01)
    *H01L 21/762*     (2006.01)
    *H01L 29/10*     (2006.01)
    *H01L 21/84*     (2006.01)
    *H01L 29/165*     (2006.01)

(52) U.S. Cl.
    CPC .... *H01L 21/823821* (2013.01); *H01L 21/845* (2013.01); *H01L 27/092* (2013.01); *H01L 27/1211* (2013.01); *H01L 29/1054* (2013.01); *H01L 29/165* (2013.01)

(58) Field of Classification Search
    CPC ............. H01L 27/1207; H01L 27/1211; H01L 21/76254; H01L 21/823807; H01L 21/823821; H01L 21/845
    See application file for complete search history.

(56) References Cited

U.S. PATENT DOCUMENTS

| | | | |
|---|---|---|---|
| 8,106,456 | B2 | 1/2012 | Khater |
| 2005/0275017 | A1 | 12/2005 | Pozder et al. |
| 2008/0036012 | A1 | 2/2008 | Yang et al. |
| 2012/0248544 | A1* | 10/2012 | Yokoyama ............ H01L 23/481 257/369 |

FOREIGN PATENT DOCUMENTS

| | | |
|---|---|---|
| KR | 100738458 B1 | 7/2007 |
| KR | 20090015941 | 2/2009 |
| KR | 1020110013261 A | 2/2011 |

OTHER PUBLICATIONS

Korean Notice of Allowance; Application No. 10-201-0142684, dated Jun. 16, 2016.

* cited by examiner

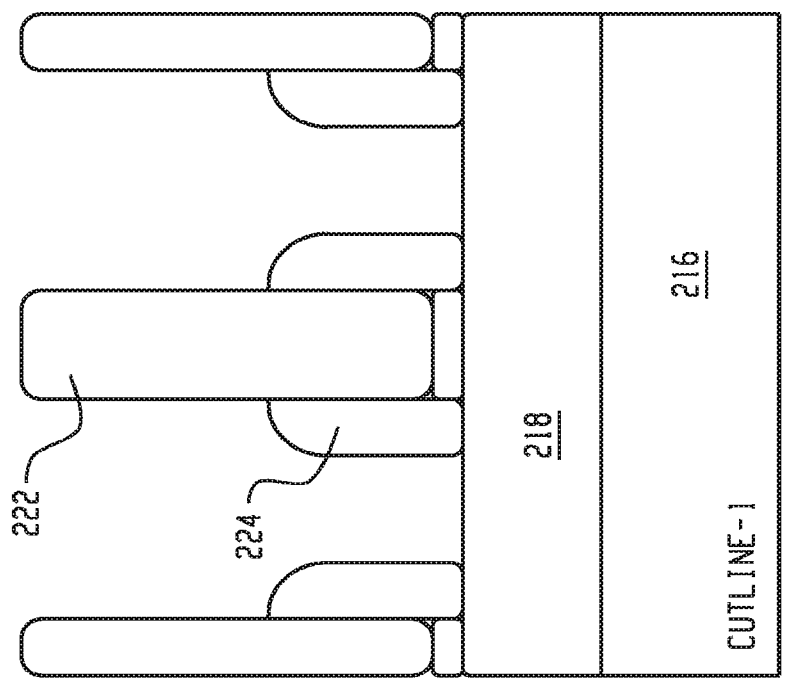
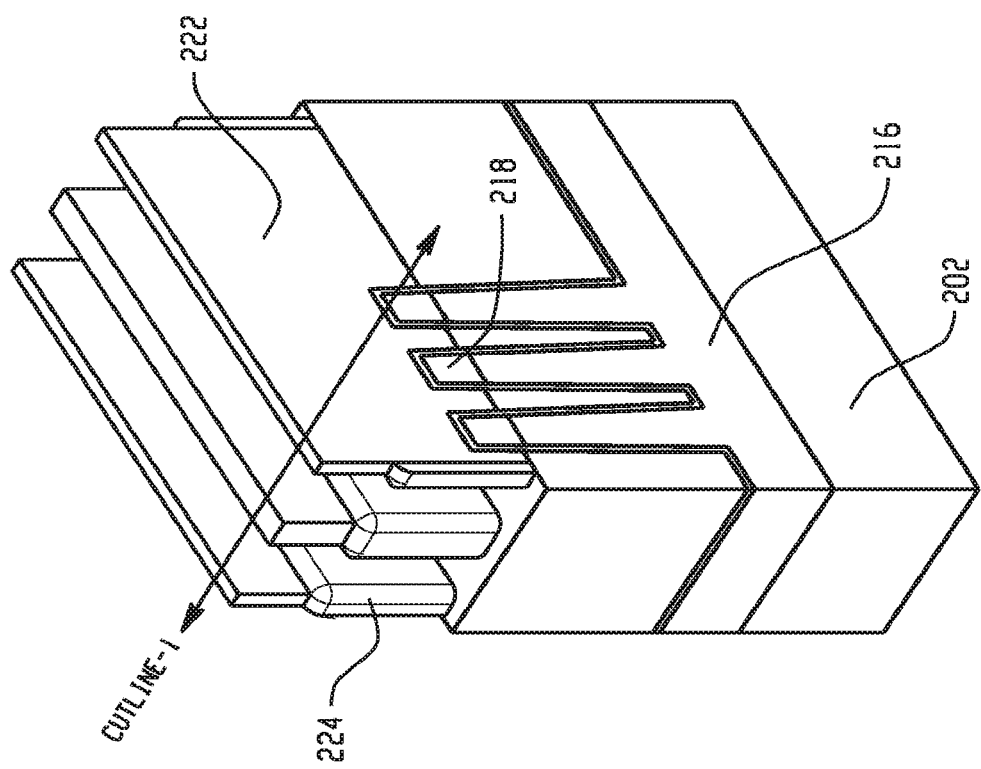
Fig. 14A
Fig. 14B

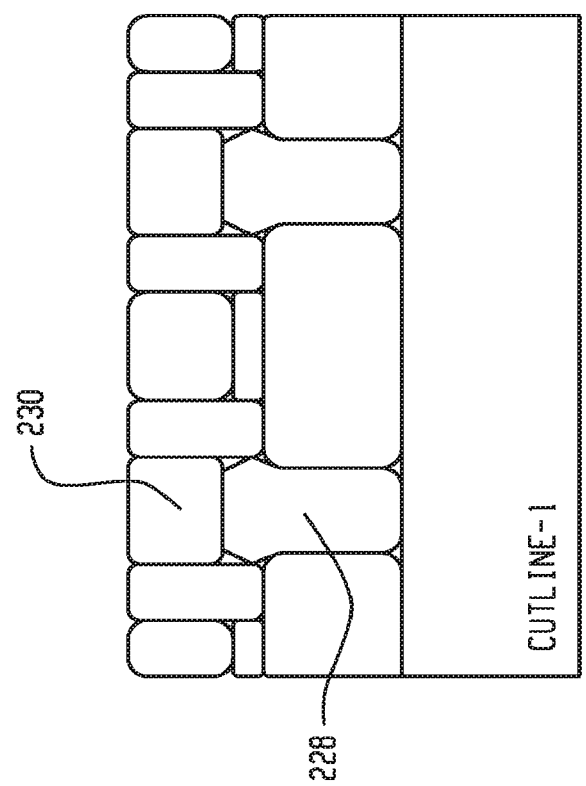
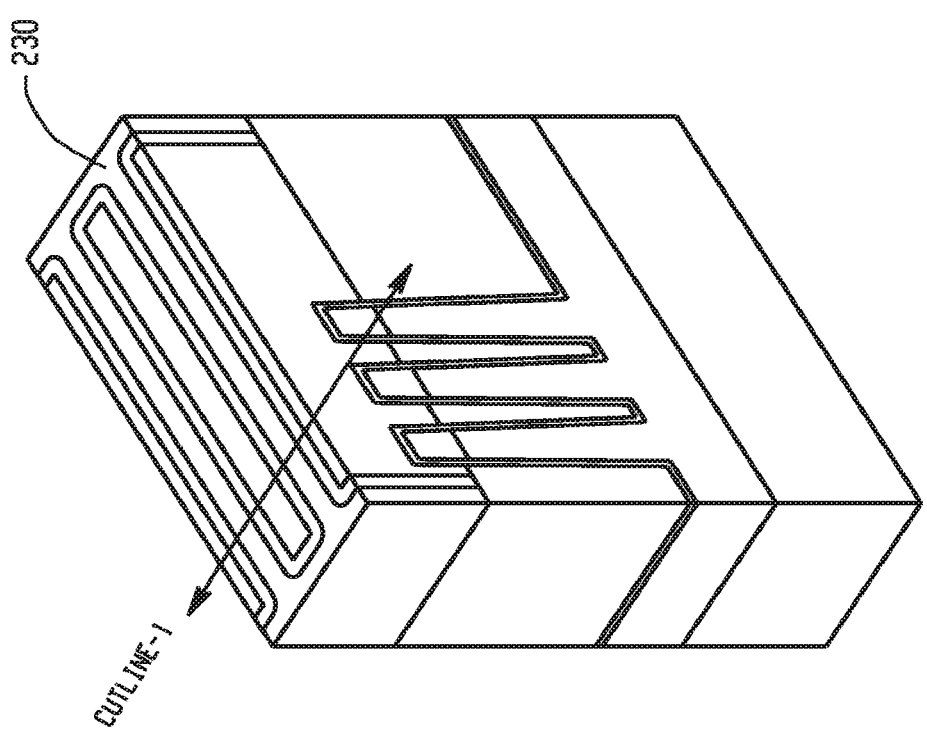
Fig. 15B
Fig. 15A

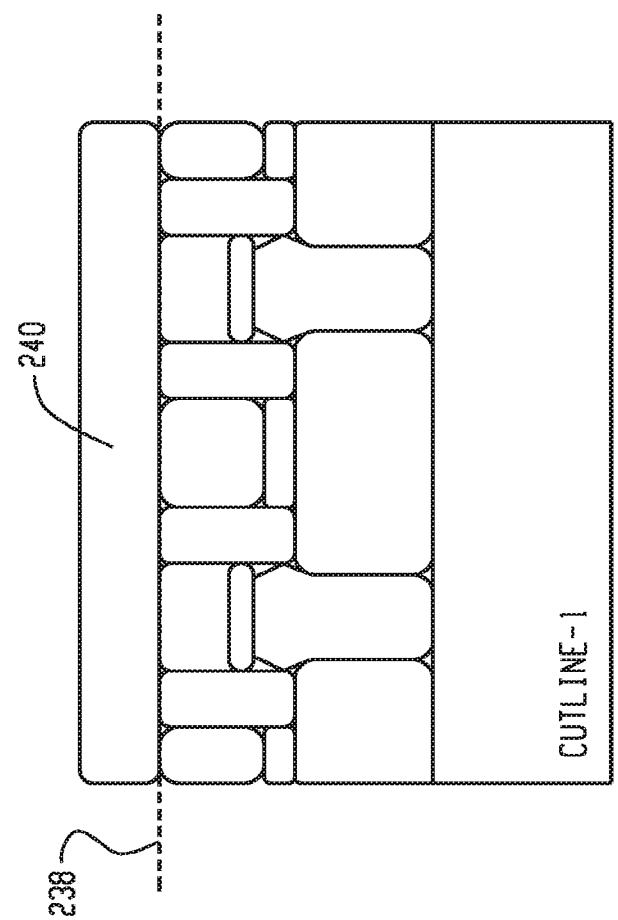
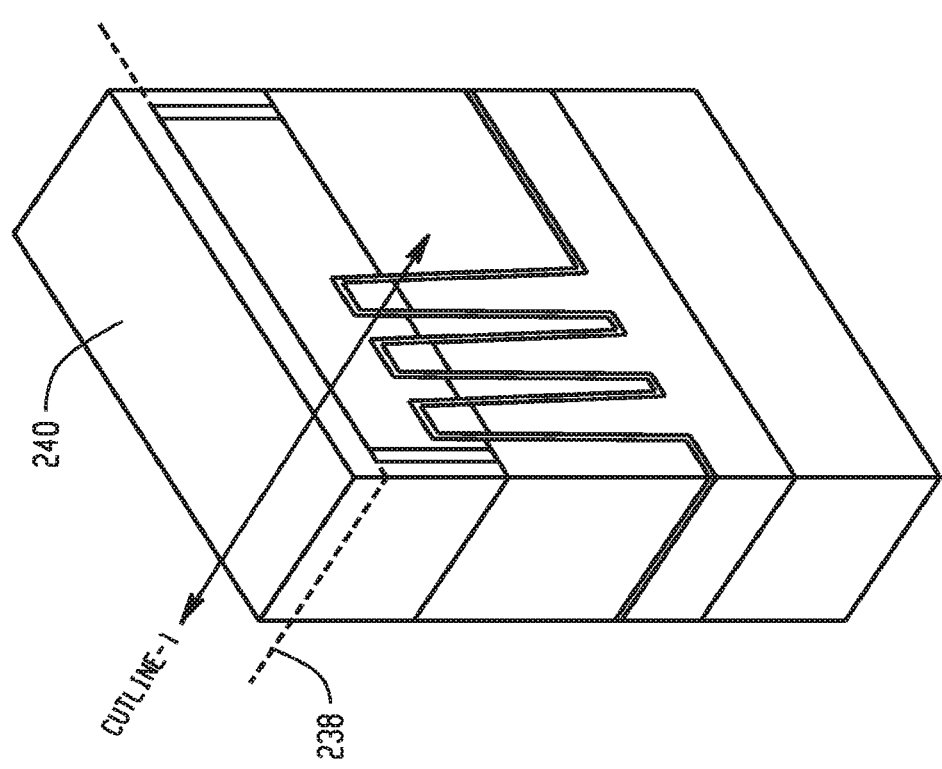
Fig. 18B
Fig. 18A

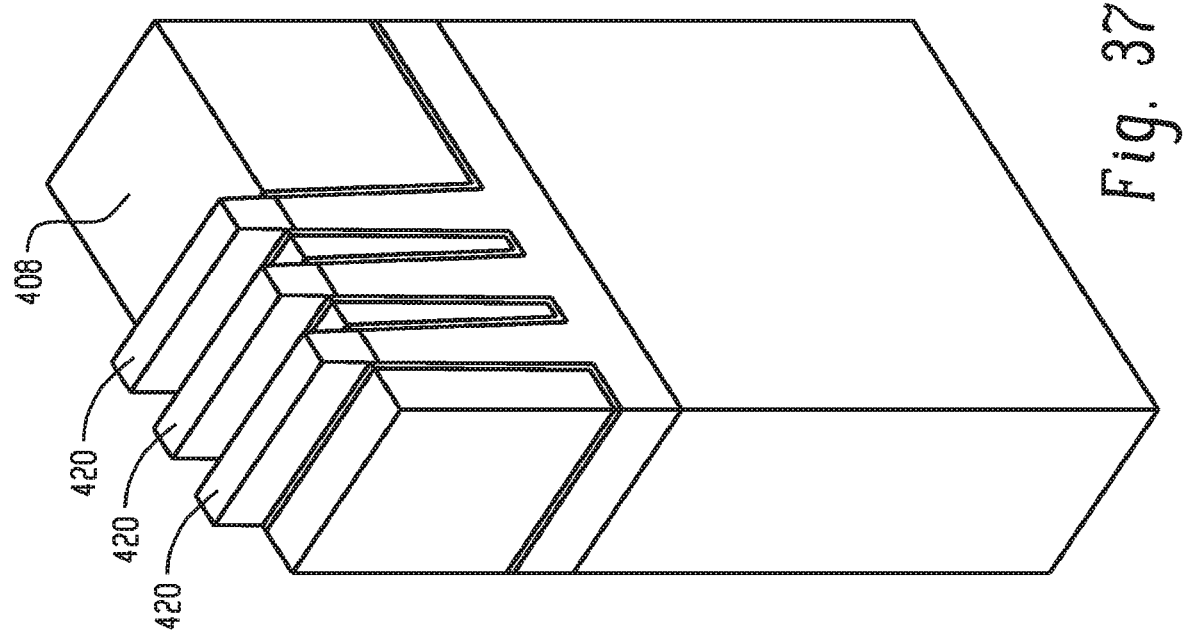

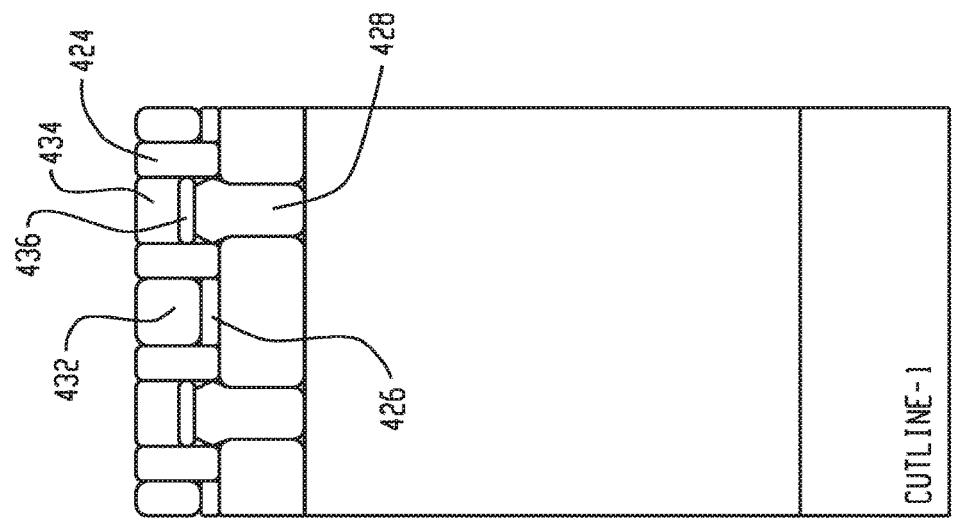
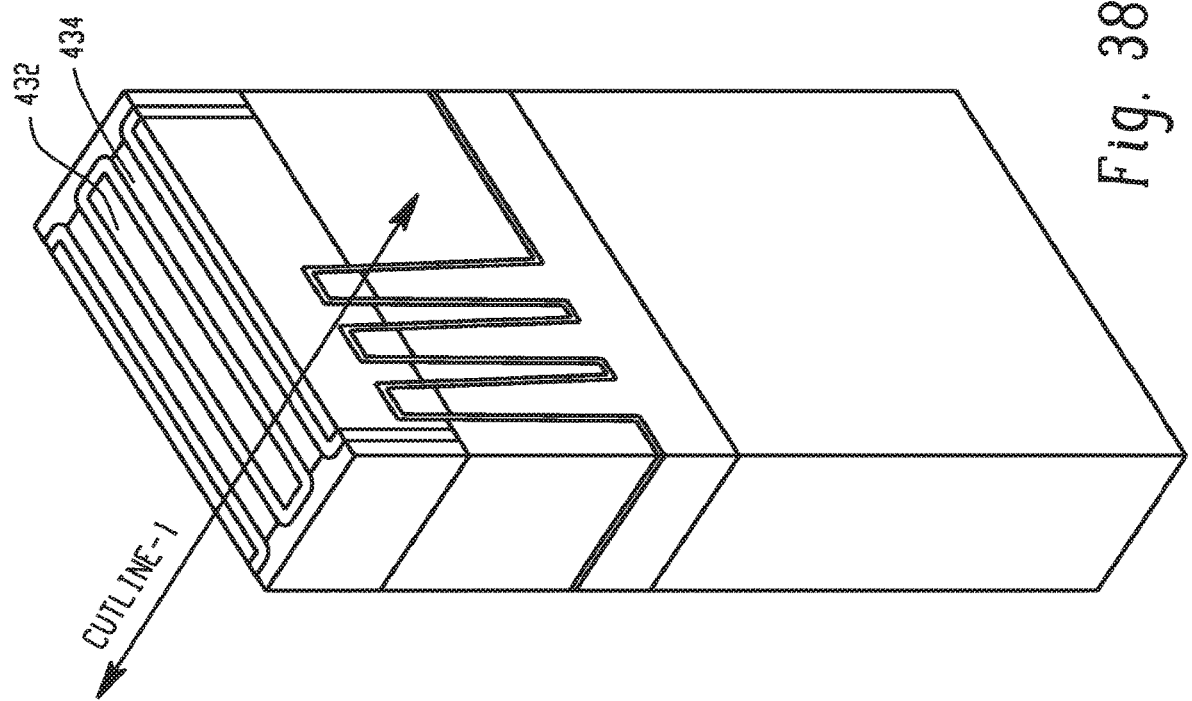
Fig. 38B
Fig. 38A

SYSTEMS AND METHODS FOR A SEMICONDUCTOR STRUCTURE HAVING MULTIPLE SEMICONDUCTOR-DEVICE LAYERS

CROSS-REFERENCE TO RELATED APPLICATIONS

This application is a divisional of U.S. application Ser. No. 14/074,932, filed Nov. 8, 2013, which application is hereby incorporated herein by reference.

TECHNICAL FIELD

The technology described in this patent document relates generally to semiconductor devices and more particularly to a semiconductor structure having multiple semiconductor device layers.

BACKGROUND

Integrated circuits ("ICs") may comprise one or more types of semiconductor devices such as n-channel MOSFET ("NMOS") devices, p-channel MOSFET ("PMOS") devices, bipolar junction transistor ("BJT") devices, diode devices, and capacitors devices among others. Different types of devices can present different design considerations for a semiconductor designer. ICs may also include circuits that have different circuit functions such as ICs having analog functions, logic functions and memory functions.

SUMMARY

In accordance with the teachings described herein, semiconductor structures having multiple semiconductor device layers and methods for fabricating semiconductor structures having multiple semiconductor device layers are provided. In one example, the semiconductor structure comprises a first semiconductor device layer fabricated on a bulk substrate with strained first channel material, a buffer layer comprising dielectric material fabricated above the first semiconductor layer and having a blanket top surface, and a second semiconductor device layer fabricated on a second substrate comprising a buried oxide and second channel material above the buried oxide. The bottom surface of the buried oxide is bonded to the blanket top surface of the buffer layer.

These aspects and other embodiments may include one or more of the following features. The buffer layer may be adapted to eliminate stress to the first channel material from the buried oxide being bonded to the blanket top surface. The buffer layer and the buried oxide may cooperate to introduce strain to the second channel material. The strained channel material may comprise channel material with compressive channel strain. The first semiconductor layer may comprise a PMOS transistor and the second semiconductor layer comprises a NMOS transistor. The bulk substrate may comprise a silicon ("Si") substrate and the first channel material comprises channel material formed by germanium ("Ge") or silicon germanium ("SiGe") epitaxy. The strained channel material may comprise channel material with tensile channel strain. The first semiconductor layer may comprise a NMOS transistor and the second semiconductor layer comprises a PMOS transistor. The semiconductor structure may further comprise a virtual substrate formed by germanium ("Ge") or silicon germanium ("SiGe") epitaxy and the first channel material may comprise channel material formed from silicon ("Si") epitaxy. One of a NMOS or PMOS device type may be exclusively fabricated on the first semiconductor device layer and the other of a NMOS or PMOS device type may be exclusively fabricated on the second semiconductor device layer.

In another example, provided is a method of fabricating a semiconductor structure with multiple semiconductor device layers. The method comprises providing a bulk substrate, providing a strained first channel material, and fabricating a first semiconductor device layer on the bulk substrate with the strained first channel material. The method further comprises fabricating a buffer layer comprising dielectric material with a blanket top surface above the first semiconductor layer, bonding to the blanket top surface a bottom surface of a second substrate comprising a buried oxide with second channel material above the buried oxide, and fabricating a second semiconductor device layer on the second substrate.

These aspects and other embodiments may include one or more of the following features. The buffer layer may be adapted to eliminate stress to the first channel material from the buried oxide being bonded to the blanket top surface. The buffer layer and the buried oxide may cooperate to introduce strain to the second channel material. The strained channel material may comprise channel material with compressive channel strain. The first semiconductor layer may comprise a PMOS transistor and the second semiconductor layer comprises a NMOS transistor. The bulk substrate may comprise a silicon ("Si") substrate and the first channel material comprises channel material formed by germanium ("Ge") or silicon germanium ("SiGe") epitaxy. The strained channel material may comprise channel material with tensile channel strain. The first semiconductor layer may comprise a NMOS transistor and the second semiconductor layer comprises a PMOS transistor. The semiconductor structure may further comprise a virtual substrate formed by germanium ("Ge") or silicon germanium ("SiGe") epitaxy and the first channel material may comprise channel material formed from silicon ("Si") epitaxy.

In another example, a method of fabricating a semiconductor structure having multiple semiconductor device layers is provided. The method comprises providing a bulk substrate and growing a first channel material on the bulk substrate wherein the lattice constant of the channel material is different from the lattice constant of the bulk substrate to introduce strain to the channel material. The method further comprises fabricating a first semiconductor device layer on the bulk substrate with the strained first channel material, fabricating a buffer layer comprising dielectric material with a blanket top surface above the first semiconductor layer, bonding to the blanket top surface a bottom surface of a second substrate comprising a buried oxide with second channel material above the buried oxide, and fabricating a second semiconductor device layer on the second substrate.

BRIEF DESCRIPTION OF THE DRAWINGS

FIGS. 7-27B are drawings depicting example states during fabrication of a semiconductor structure having multiple transistor (or semiconductor) layers.

FIGS. 32-41B are drawings depicting example states during fabrication of a semiconductor structure having multiple transistor (or semiconductor) layers.

DETAILED DESCRIPTION OF ILLUSTRATIVE EMBODIMENTS

The use of two or more semiconductor device layers in a semiconductor structure may, in some implementations, simplify semiconductor fabrication while allowing for the advantageous use of certain channel material in the fabrication of some semiconductor devices and the use of different channel material in the fabrication of other semiconductor devices. For example, mobility boost may be gained by using one type of channel material for NMOS transistors and another type of channel material for PMOS transistors.

Figure 1:
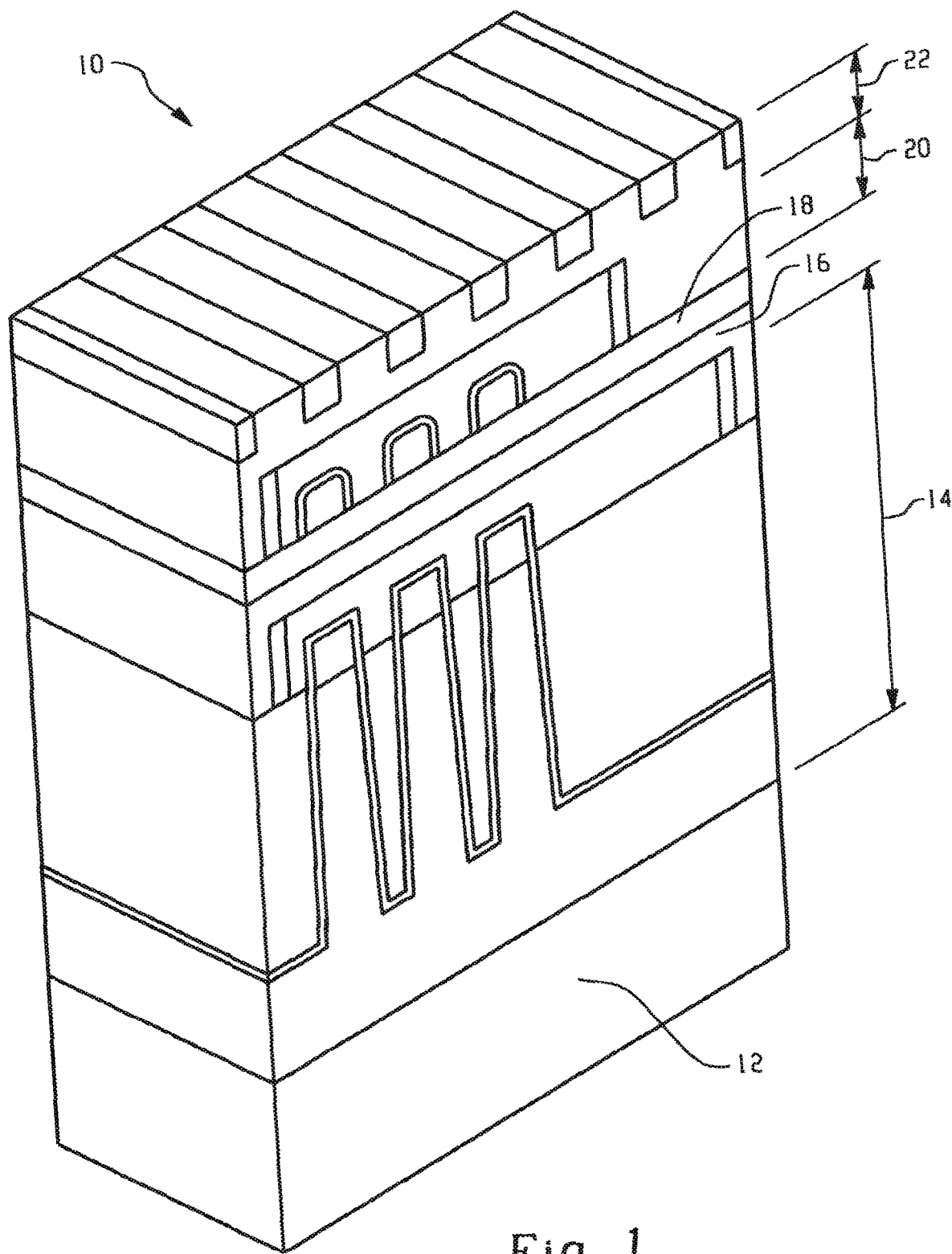
FIG. 1 is a block diagram providing a cross-sectional view of an example semiconductor structure having multiple transistor (or semiconductor) layers.

FIG. 1 is a cross-sectional view of an example semiconductor structure to having multiple transistor layers. The semiconductor structure comprises a first transistor layer 14 fabricated on a bulk substrate 12 and a second transistor layer 20 fabricated on a semiconductor-on-insulator ("SOI") structure. In particular the semiconductor structure to comprises a bulk substrate 12, a first transistor layer 14 above the bulk substrate 12, a blanket layer 16 comprising ILD0 oxide deposited above the first transistor layer 14, a buried oxide layer 18 above the blanket layer 16, a second transistor layer 200 above the buried oxide 18, and a back-end-of-line ("BEOL") layer 22 above the second transistor layer 20.

In addition to a mobility boost that can be attained by integrating different channel materials for NMOS and PMOS transistors, channel material epitaxy on a bulk substrate with a larger or smaller lattice constant than that of the bulk substrate can introduce strain to the channel material and further enhance the mobility and electrical performance of transistors fabricated using the channel material.

If PMOS transistors are fabricated in a first transistor layer and NMOS transistors fabricated in a second transistor level, a compressive channel strain can be introduced by channel material epitaxy on the bulk substrate with a smaller lattice constant than that of the bulk substrate to boost the mobility of PMOS transistors (e.g., SiGe or Ge epitaxy on the silicon substrate). Providing a glue/buffer layer and buried oxide between the first and second transistor layers should also introduce a compressive strain on NMOS transistors fabricated in the second transistor level and should not degrade the compressive strain on the PMOS transistors after the process of wafer bonding.

If NMOS transistors are fabricated in a first transistor layer and PMOS transistors fabricated in a second transistor level, a tensile channel strain can be introduced by channel material epitaxy on the bulk substrate with a larger lattice constant than that of the bulk substrate to boost the mobility of NMOS transistors (e.g., Si epitaxy on a thick and fully relaxed Ge or SiGe virtual substrate). Providing a glue/buffer layer and buried oxide between the first and second transistor layers should also introduce tensile strain on PMOS transistors fabricated in the second transistor level and should not degrade the tensile strain of the NMOS transistors after the process of wafer bonding.

An amorphous buffer layer with sufficient thickness (e.g., 10 nm~20 nm) between the bonding interface and the first transistor layer can help prevent the channel strain from being degraded and the performance of transistors fabricated on the first transistor level from being degraded when bonding the second channel material and buried oxide to the buffer layer. In some embodiments, the buffer layer may comprise a film of BPSG, BSG or PSG oxide (or the same as ILD0).

Figure 2:
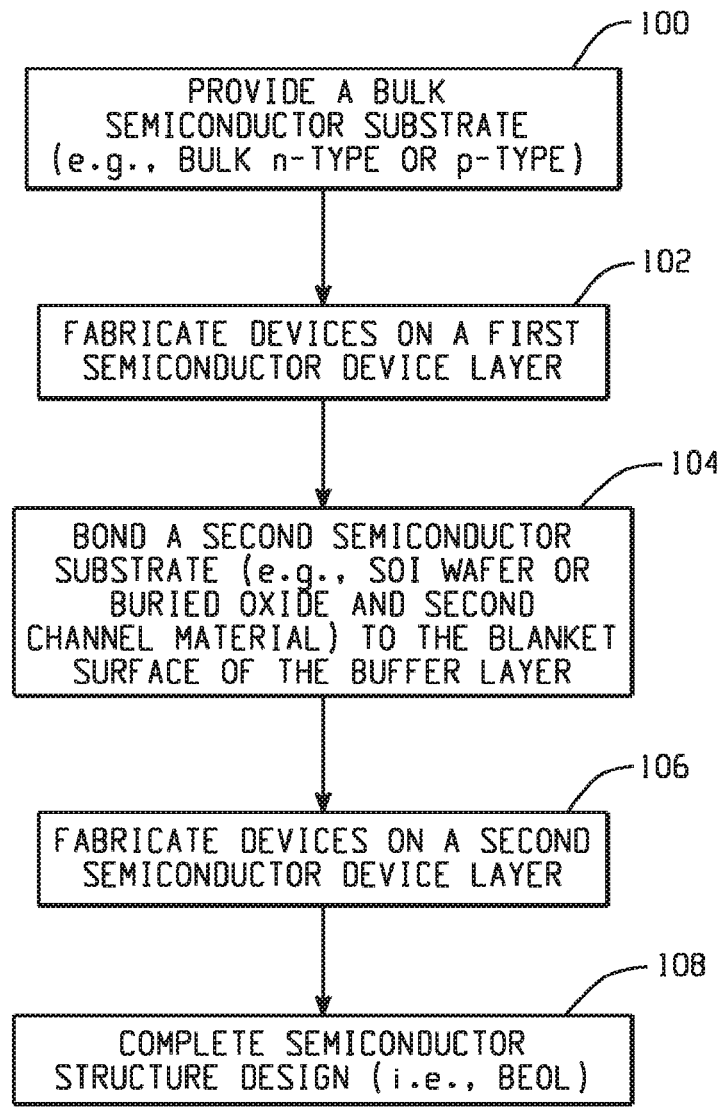
FIGS. 2-6 are process flow charts depicting example methods for generating a semiconductor structure having multiple transistor (or semiconductor) layers.

FIG. 2 is a process flow chart depicting an example method for creating a multi-layer semiconductor structure having two semiconductor device layers. A bulk semiconductor substrate is provided (operation 100) for the first layer. In some embodiments the bulk substrate can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonite; an alloy semiconductor including SiGe, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate may include isolation regions, doped regions, and/or other features.

The first semiconductor device layer is fabricated on the bulk substrate (operation 102). The first semiconductor device layer can include devices of a first type or devices that perform a particular function. The first semiconductor layer may be fabricated using suitable processes including photolithography, etching, cleaning, chemical mechanical polishing/planarization ("CMP"), thin film deposition, thermal process (e.g., doping, activation/surface, passivation/material consolidation), epitaxy, and material filling, among others. For example, the photolithography process may include forming a photoresist layer ("resist"), exposing the resist to a pattern, performing post-exposure bake processes, and developing the resist to form a masking element. The masking element may then be used in an etching process. The etching may be performed using reactive ion etch ("RIE") and/or other suitable processes. The fabrication of the first transistor level includes fabricating a glue/buffer layer on the top of the first transistor level. The buffer layer comprises a dielectric or other insulating material and has a blanket (i.e., uniform) top surface.

After the devices on the first semiconductor layer are fabricated, a second semiconductor substrate is provided and bonded to the top surface of the buffer layer, which is above the first semiconductor device layer (operation 104). The second semiconductor substrate comprises a semiconductor on insulator ("SOI") substrate with a buried oxide layer and channel material above the buried oxide layer. The bottom surface of the buried oxide insulator of the SOI substrate is bonded to the top surface of the buffer layer. In some embodiments, the bonding surface of the buried oxide insulator and blanket surface of the buffer layer are processed to clean, remove excess particles, and make the surfaces hydrophobic or hydrophilic. After the surfaces are processed, the wafer containing the first semiconductor layer and the wafer containing the SOI substrate are aligned. After alignment the layers can be bonded through a touch and press process. The Van der Waals force will link the atoms of the interface between the bottom of the second semiconductor layer and the top of the first semiconductor layer together (this process may involve some plasma enhancement technique). Also a thermal procedure can be applied to enhance the linking of atoms at the interface. The resultant semiconductor structure can have a planarization process or CMP process applied to reduce the thickness of second semiconductor layer to the required thickness (e.g., 5-20 nm, the channel thickness of the $2^{nd}$ device).

The second semiconductor substrate has a semiconductor on insulator ("SOI") structure comprising a buried oxide and a second channel material. The buried oxide functions as an electrical insulator underneath the semiconductor channel material. The buried oxide may be formed from material such as $SiO_2$, HfO, $Al_2O_3$ or other suitable oxide material. The electrical insulator functions to insulate the second channel material in the second semiconductor substrate from the devices formed on the first semiconductor device layer.

The second channel material may be formed from material such as Si, SiGe, GaAs, or others. The second channel material may be the same as or different from the semiconductor channel material used in the first semiconductor device layer. This can allow for selectively constructing certain semiconductor devices with the channel material of the first semiconductor substrate and other semiconductor devices with the channel material of the second semiconductor substrate. For example, the channel material of the first semiconductor substrate may be Ge and used for fabricating PMOS devices, and the channel material of the second semiconductor substrate may be GaAs and used for fabricating NMOS devices for boosting the performance of NMOS and PMOS transistors.

After bonding, a second semiconductor device layer is fabricated on the second semiconductor substrate (operation 106). The second semiconductor layer may be fabricated using a number of suitable processes including photolithography, etching, cleaning, chemical mechanical polishing/planarization ("CMP"), thin film deposition, thermal process, epitaxy, and material filling, among others.

After fabricating the second semiconductor device layer, the semiconductor structure can be completed (operation 108). Completion comprises back end of line ("BEOL") operations where the individual devices are interconnected with wiring on the multi-layer semiconductor structure. BEOL may include fabrication of contacts, insulating layers (e.g., dielectrics), metal levels, and bonding sites for chip-to-package connections.

Figure 3:
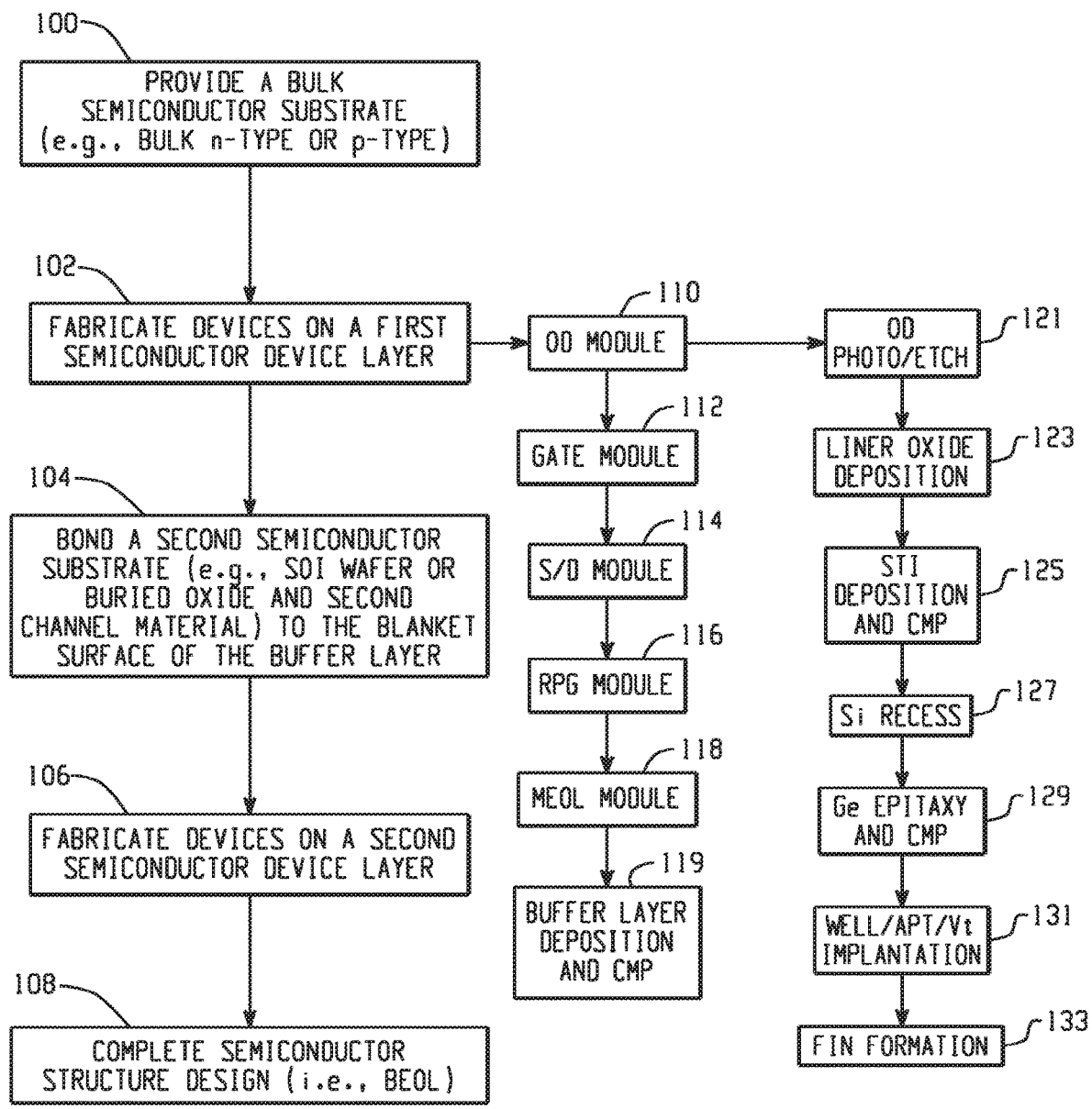

FIG. 3 is a process flow chart depicting another example method for creating a multi-layer semiconductor structure having two semiconductor device layers. This example method involves providing a bulk substrate for a first semiconductor device layer (operation 100), fabricating the first semiconductor layer with a blanket top surface on a buffer layer (operation 102), bonding the bottom insulator surface of a SOI substrate (or bond buried oxide and channel material) to the top blanket surface of the buffer layer (operation 104), fabricating the second device layer on the SOI substrate (operation 106), and completing the semiconductor structure with wiring and metallization layers (operation 108). The example method of FIG. 3 is similar to the example method of FIG. 2, but provides specific examples regarding how the first semiconductor layer may be fabricated and how strain may be introduced to boost mobility and electrical performance of fabricated devices.

In particular, fabrication of devices in the first semiconductor device layer, in this example, involves an oxidation ("OD") module process (operation 110), a gate module process (operation 112), a source/drain module process (operation 114), a remove poly gate module process (operation 116), a middle end of line ("MEOL") module process (operation 118), and a buffer layer deposition and CMP process (operation 119).

Figure 7:
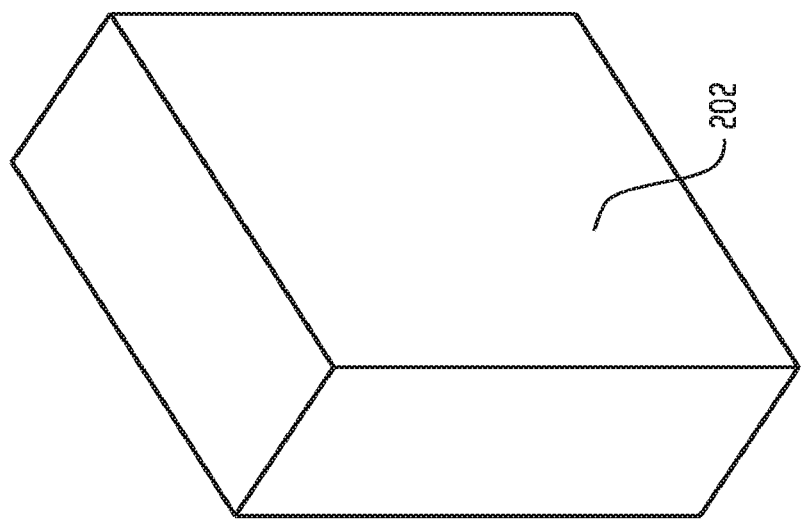

FIG. 7 depicts an isometric view of an example portion of a bulk wafer 202 that may be provided for use with the methods described in FIG. 3 to fabricate a multi-layer semiconductor structure. The bulk substrate 202 comprises a silicon substrate.

Figure 8:
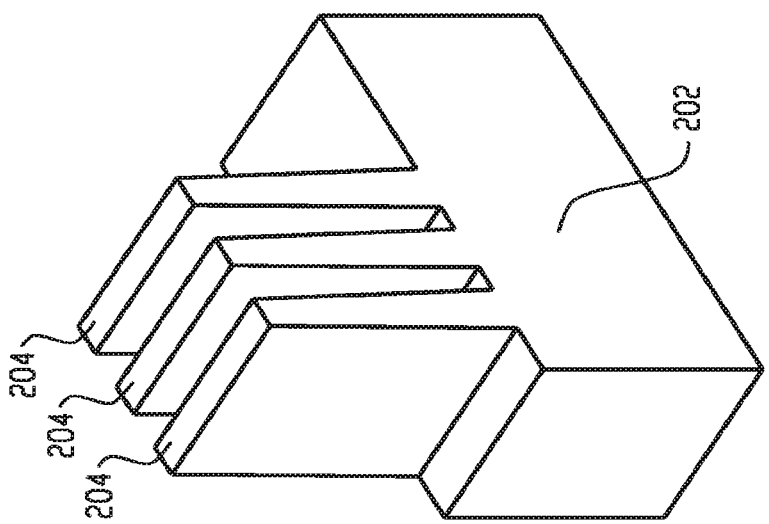

Referring back to FIG. 3, the OD module process (operation 110) may comprise a number of iterations of photolithography and etching operations (operation 120). The photolithography and etching operations may result in substrate material being removed from certain regions of the bulk substrate. FIG. 8 depicts an isometric view of a portion of the semiconductor structure after completion of the photolithography and etching operations (operation 120 of FIG. 3). Shown are OD fins 204 on the bulk substrate 202 for a PMOS transistor.

Figure 9:
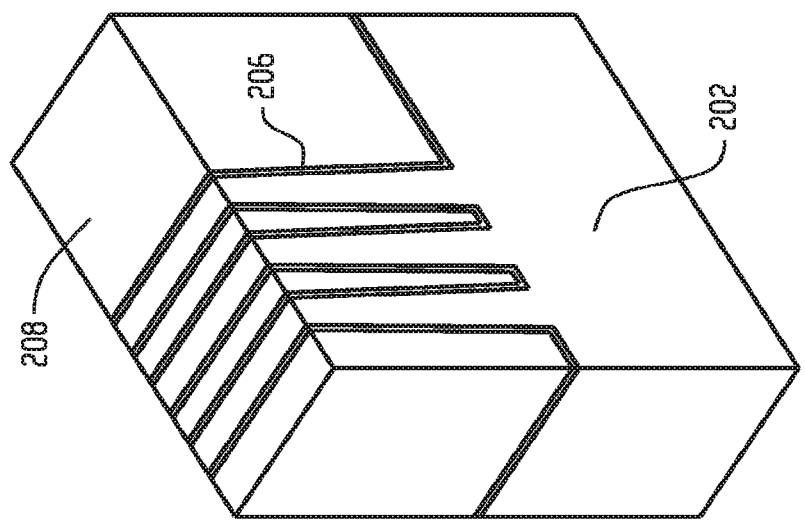

Referring back to FIG. 3, the OD module process (operation 110) may further comprise liner oxide deposition (operation 122) and shallow trench isolation ("STI") deposition and CMP (operation 124). The liner oxide deposition and STI deposition and CMP may result in liner oxide and STI being deposited within the regions vacated during the photolithography and etching operations (operation 120). FIG. 9 depicts an isometric view of a portion of the semiconductor structure after completion of liner oxide deposition (operation 122 of FIG. 3) and STI deposition and CMP (operation 124 of FIG. 3). Shown are the deposited liner oxide 206 and the deposited STI material 208.

Referring back to FIG. 3, the OD module process (operation 110) may further comprise silicon recess formation (operation 126). FIG. to depicts an isometric view of a portion of the semiconductor structure after completion of silicon recess formation (operation 126 of FIG. 3). Shown are formed silicon recesses 210.

Figure 11:
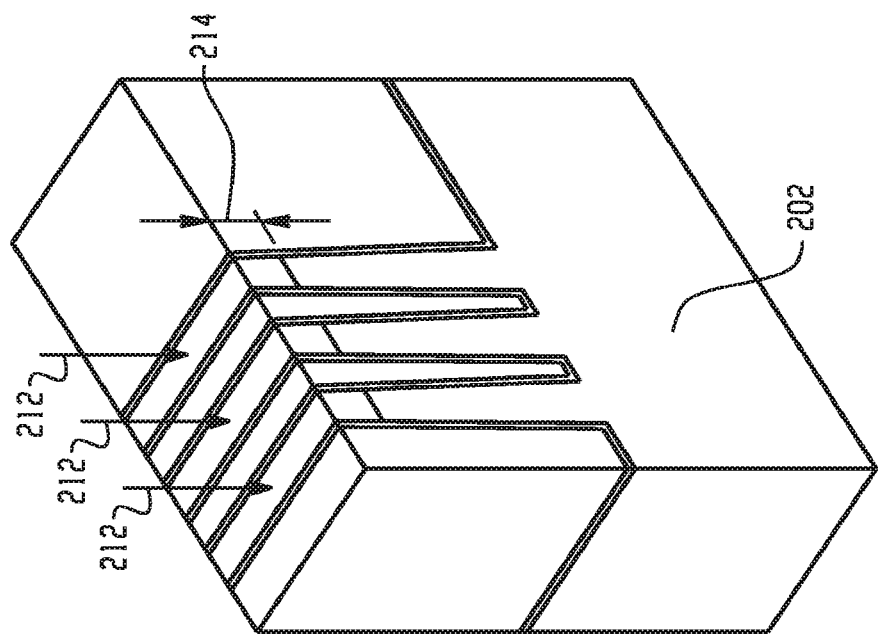
Figure 10:
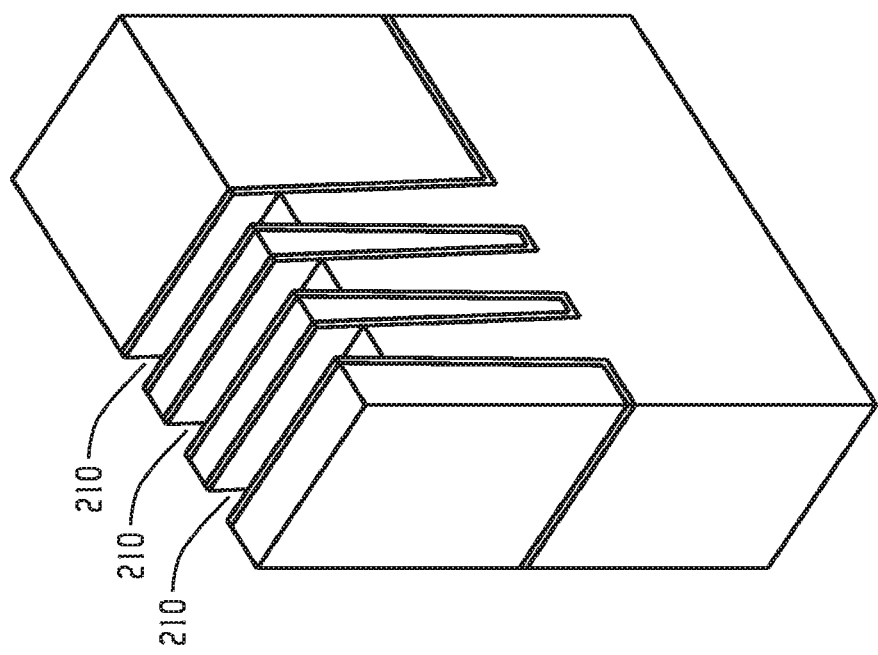

Referring back to FIG. 3, the OD module process (operation 110) may further comprise Ge or SiGe epitaxy and CMP (operation 128). FIG. 11 depicts an isometric view of a portion of the semiconductor structure after completion of Ge or SiGe epitaxy and CMP (operation 128 of FIG. 3) in the former silicon recesses. Shown is the epitaxial grown Ge or SiGe 212. The Ge or SiGe epitaxy will align the lattice of Si substrate 202. The intrinsic lattice constant of Ge or SiGe is larger than that of silicon. Therefore, the channel material will experience a compress strain. In this example, the thickness 214 of the Ge or SiGe epitaxy is about 10 nm~30 nm and the strain may be relaxed with larger epitaxy depth.

Figure 12:
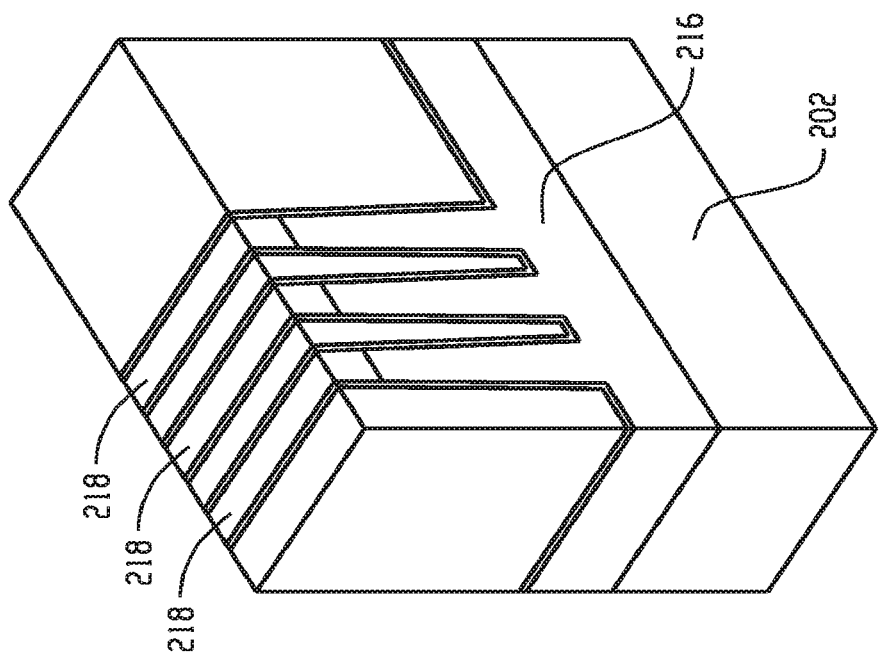

Referring back to FIG. 3, the OD module process (operation 110) may further comprise well implantation (operation 130). FIG. 12 depicts an isometric view of a portion of the semiconductor structure after completion of well implantation (operation 130 of FIG. 3). Shown are the silicon substrate with N-well implantation 216 and Ge or SiGe with N-well implantation 218.

Figure 13:
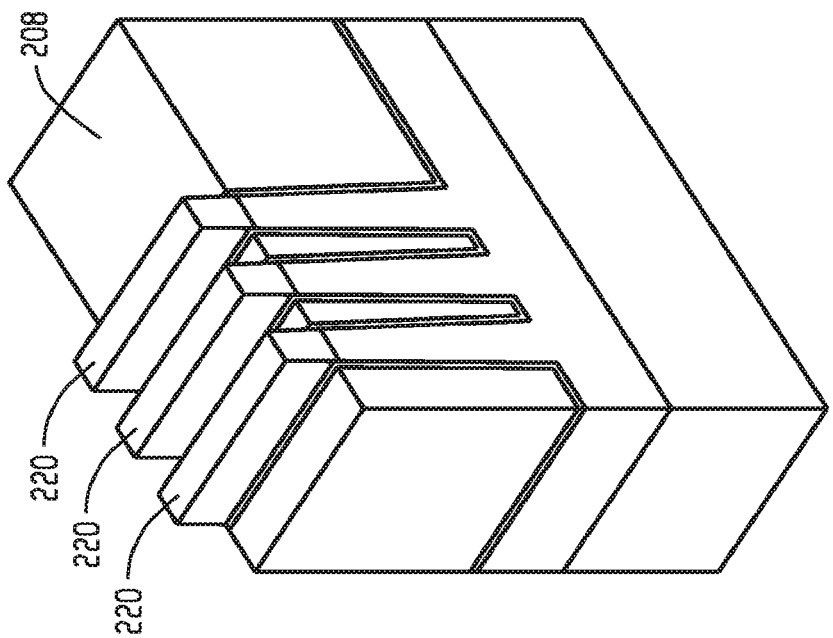

Referring back to FIG. 3, the OD module process (operation 110) may further comprise fin formation (operation 132). FIG. 13 depicts an isometric view of a portion of the semiconductor structure after completion of fin formation (operation 132 of FIG. 3). Shown are fins 220 after removal of STI material 208 surrounding the fins 220.

Figure 4:
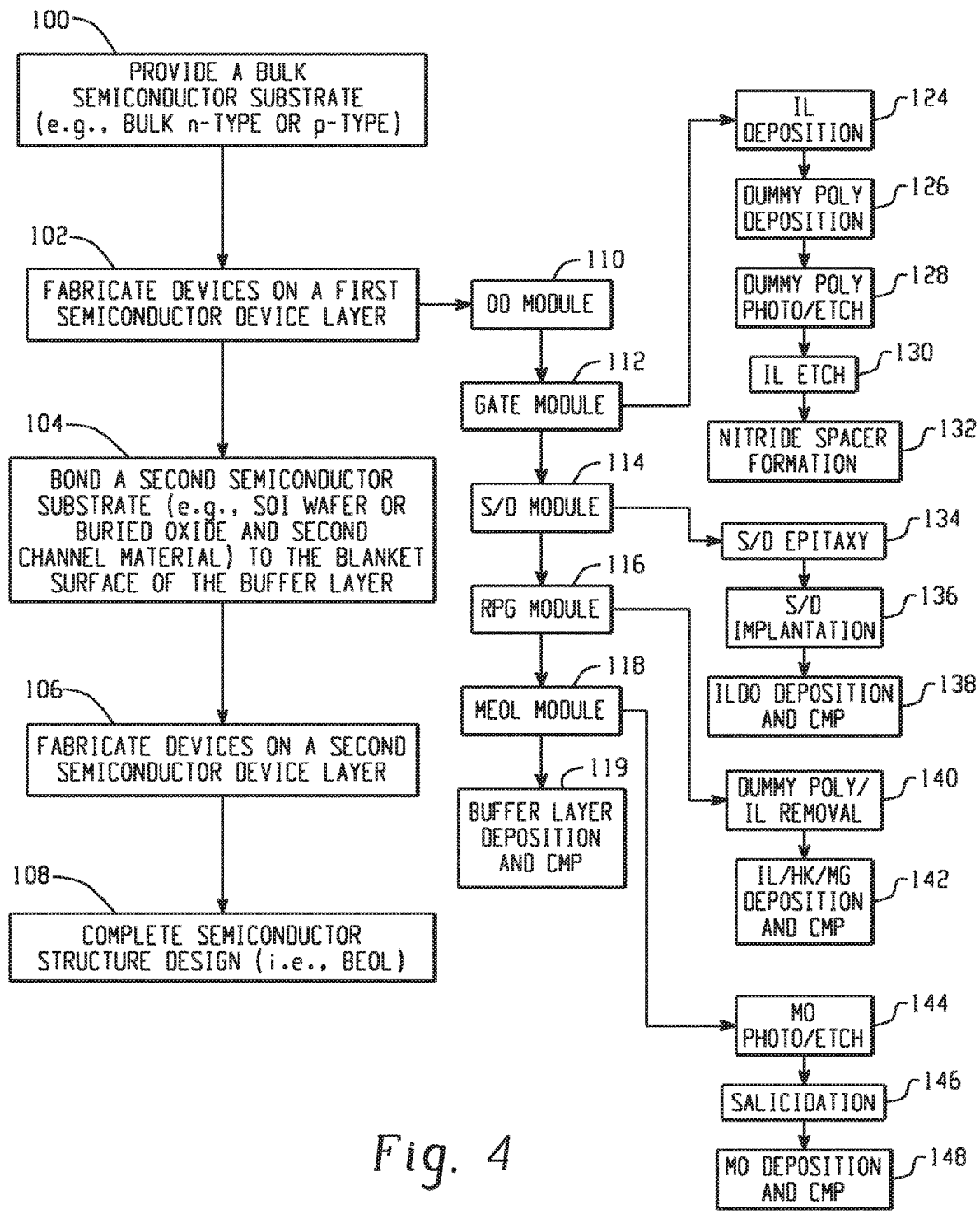

FIG. 4 is a process flow chart depicting another example method for creating a multi-layer semiconductor structure having two semiconductor device layers. This example method involves providing a bulk substrate for a first semiconductor device layer (operation 100), fabricating the first semiconductor layer with a blanket top surface on a buffer layer (operation 102), bonding the bottom insulator surface of a SOI substrate (or bond buried oxide and channel material) to the top blanket surface of the buffer layer (operation 104), fabricating the second device layer on the SOI substrate (operation 106), and completing the semiconductor structure with wiring and metallization layers (operation 108). The example method of FIG. 4 is similar to the example method of FIG. 2, but provides specific examples regarding how the first semiconductor layer may be fabricated.

In particular, fabrication of devices in the first semiconductor device layer, in this example, involves an oxidation ("OD") module process (operation 110), a gate module process (operation 112), a source/drain module process (operation 114), a remove poly gate module process (operation 116), a middle end of line ("MEOL") module process (operation 118), and a buffer layer deposition and CMP process (operation 119).

The gate module process (operation 112), may comprise operations such as depositing isolation oxide material (operation 124), dummy poly deposition (operation 126), dummy poly photolithography/etching (operation 128), etching isolation oxide material (operation 130), and nitride spacer formation (operation 132).

FIG. 14A depicts an isometric view of a portion of the semiconductor structure after completion of the gate module process (operation 112 of FIG. 4). FIG. 14B provides a cross-sectional view of the semiconductor structure from cutline 1 of FIG. 14A. Shown are dummy poly 222, nitride spacers 224, and IL/HK 226.

Referring back to FIG. 4, the source/drain module process (operation 114) may involve source/drain epitaxial growth operations (operation 134), source/drain implantation operations (operation 136), and interlayer dielectric deposition and CMP (operation 138). FIG. 15A depicts an isometric view of the semiconductor structure after completion of the source/drain module (operation 114 of FIG. 4). FIG. 15B provides a cross-sectional view of the semiconductor structure from cutline 1 of FIG. 15A. Shown are the source/drain material 228 after epitaxy and P+ implantation and the deposited interlayer dielectric material 230.

Figure 16B:
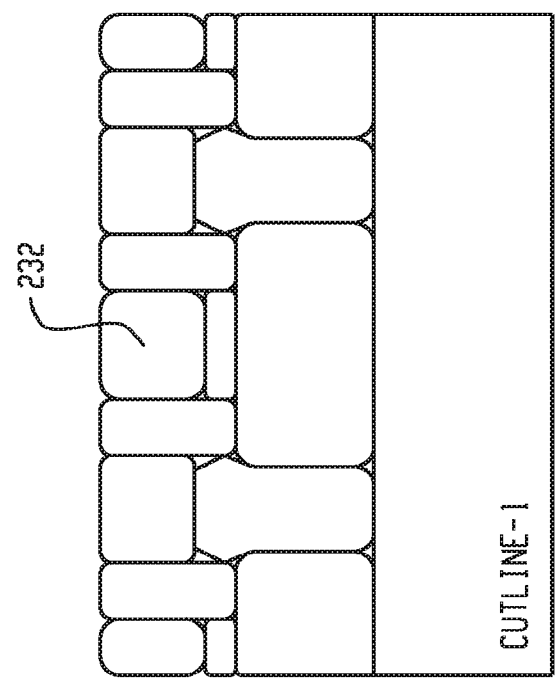
Figure 16A:
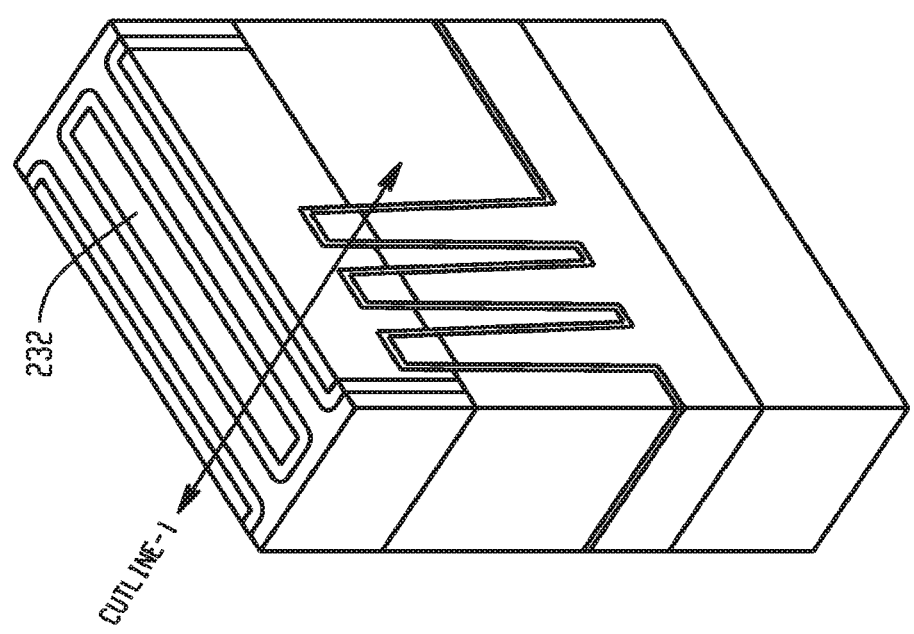

Referring back to FIG. 4, the remove poly gate module process (operation 116) may involve dummy poly/isolation oxide removal (operation 140) and isolation oxide/high K/metal gate deposition and CMP (operation 142). FIG. 16A depicts an isometric view of a portion of the semiconductor structure after the remove poly gate module process (operation 116 of FIG. 4). FIG. 16B provides a cross-sectional view of the semiconductor structure from cutline 1 of FIG. 16A. These figures show the deposited metal gate material 232. The deposited metal gate material may comprise material such as Al or W.

Figure 17B:
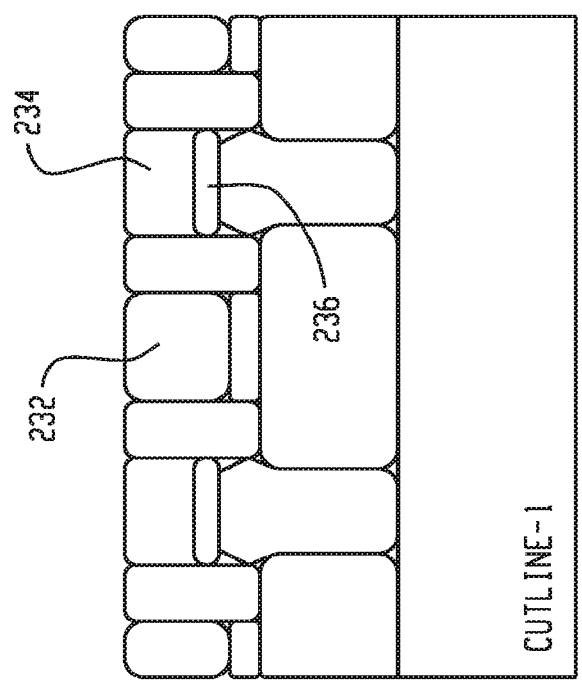
Figure 17A:
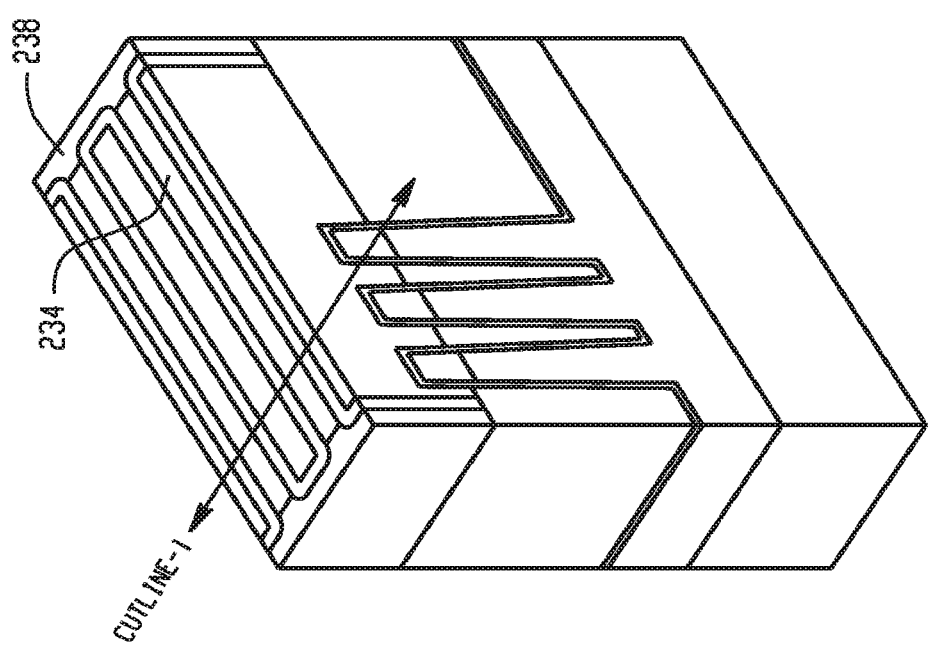

The MEOL module process (operation 118) may involve M0 photolithography and etching operations (operation 144), salicidation (operation 146), and M0 deposition and CMP (operation 148). FIG. 17A depicts an isometric view of a portion of the semiconductor structure after the MEOL module process (operation 118 of FIG. 4). FIG. 17B provides a cross-sectional view of the semiconductor structure from cutline 1 of FIG. 17A. These figures show the addition of M0 metal material 234 and silicide 236 above source and drain regions. The top surface 238 of first transistor layer has patterned features and is composed of several non-homogenous materials such as metal gate, nitride spacer, M0 metal and ILD0 oxide.

Referring back to FIG. 4, the buffer layer deposition and CMP process (operation 119) results in a glue/buffer layer being deposited onto the top surface of the first transistor layer to produce a uniform, non-patterned, no topography and homogeneous surface for wafer bonding. In this example, a feasible thickness for this layer is about 10 nm~20 nm to eliminate the stress induced by subsequent wafer bonding. In another example, the stress of the buffer layer is a compressive stress no greater than about $2 \times 10^9$ dynes/cm$^2$, or a tensile stress no greater than $1 \times 10^9$ dynes/cm$^2$ to eliminate the stress induced by subsequent wafer bonding.

FIG. 18A depicts an isometric view of a portion of the semiconductor structure after the buffer layer deposition and CMP process (operation 119 of FIG. 4). FIG. 18B provides a cross-sectional view of the semiconductor structure from cutline 1 of FIG. 18A. These figures show the glue/buffer layer 240 deposited on top surface 238 of the first transistor layer.

Figure 5:
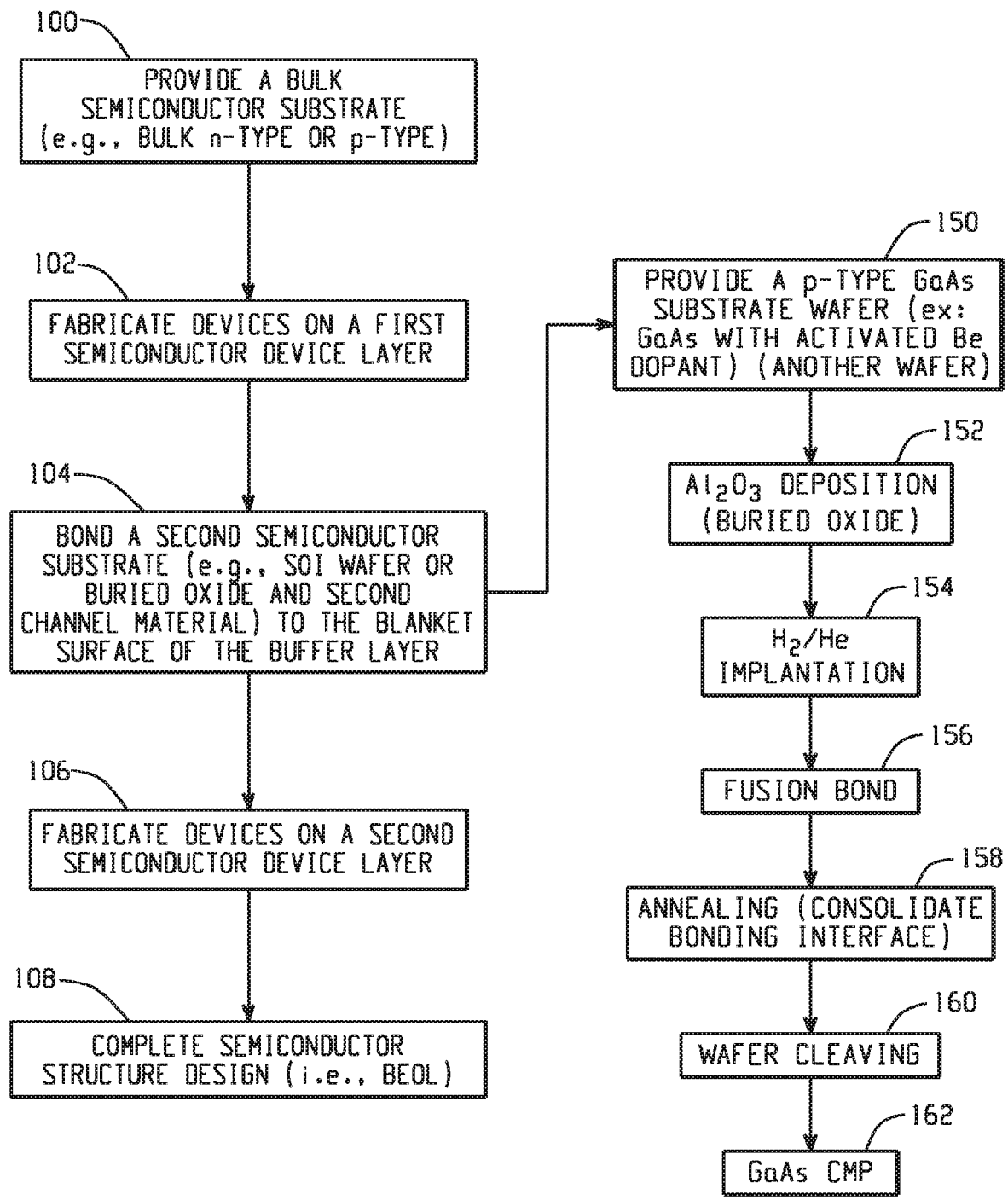

FIG. 5 is a process flow chart depicting another example method for creating a multi-layer semiconductor structure having two semiconductor device layers. This example method involves providing a bulk substrate for a first semiconductor device layer (operation 100), fabricating the first semiconductor layer with a blanket top surface on a buffer layer (operation 102), bonding the bottom insulator surface of a SOI substrate (or bond buried oxide and channel material) to the top blanket surface of the buffer layer (operation 104), fabricating the second device layer on the SOI substrate (operation 106), and completing the semiconductor structure with wiring and metallization layers (operation 108). The example method of FIG. 5 is similar to the example method of FIG. 2, but provides specific examples regarding how the second semiconductor substrate may be bonded to the surface of the first semiconductor device.

Figure 19:
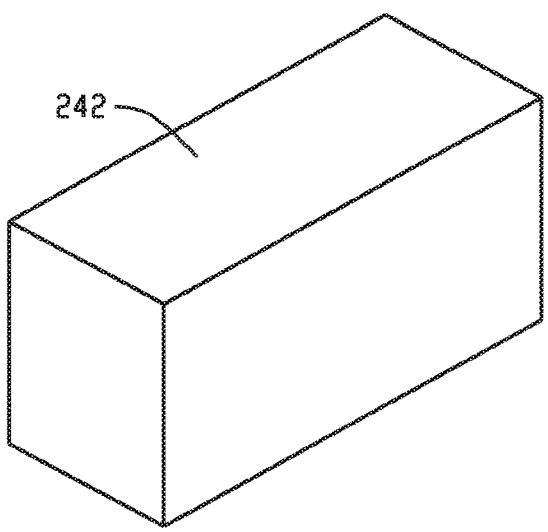

In particular, referring to FIG. 5, bonding the bottom insulator surface of a SOI substrate (or bond buried oxide and channel material) to the top blanket surface of the buffer layer, in this example, comprises providing a separate substrate (operation 150). As an example, the substrate may comprise GaAs with an activated Be dopant. FIG. 19 depicts an isometric view of the separate substrate 242. In this example, the substrate comprises GaAs with P-well implantation.

Figure 20:
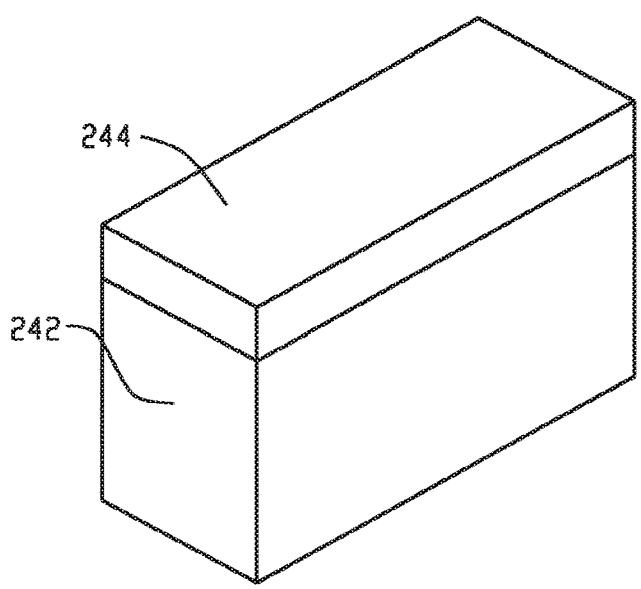

Referring back to FIG. 5, bonding the bottom insulator surface of a SOI substrate (or bond buried oxide and channel material) to the top blanket surface further comprises depositing a defect free buried oxide layer (operation 152) onto the substrate. FIG. 20O depicts an isometric view of the substrate 242 with deposited buried oxide 244. In this example, the buried oxide comprises $Al_2O_3$, $HfO_2$, $SiO_2$, or some other suitable oxide material. In this example, the thickness of this layer is about 10 nm~20 nm in view of the isolation function of the SOI structure and the depth of subsequent contact etching and filling.

Figure 21:
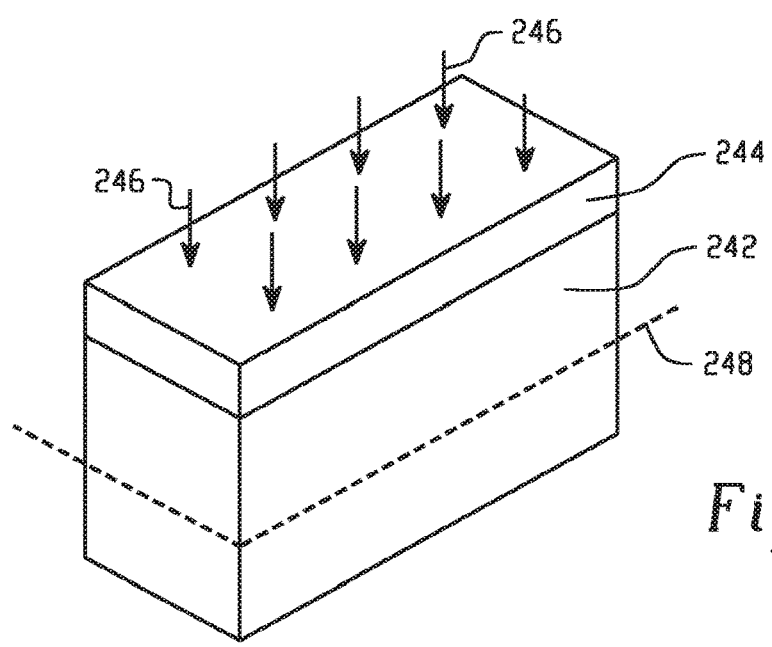

Referring back to FIG. 5, bonding the bottom insulator surface of a SOI substrate (or bond buried oxide and channel material) to the top blanket surface further comprises $H_2$/He implantation (operation 154). FIG. 21 depicts an isometric view of the deposited buried oxide 244 and substrate 242 subjected to $H_2$/He implantation to introduce the $H_2$/He 246 into the GaAs substrate 242 to a level 248 to weaken the interface atom linkage.

Figure 22:
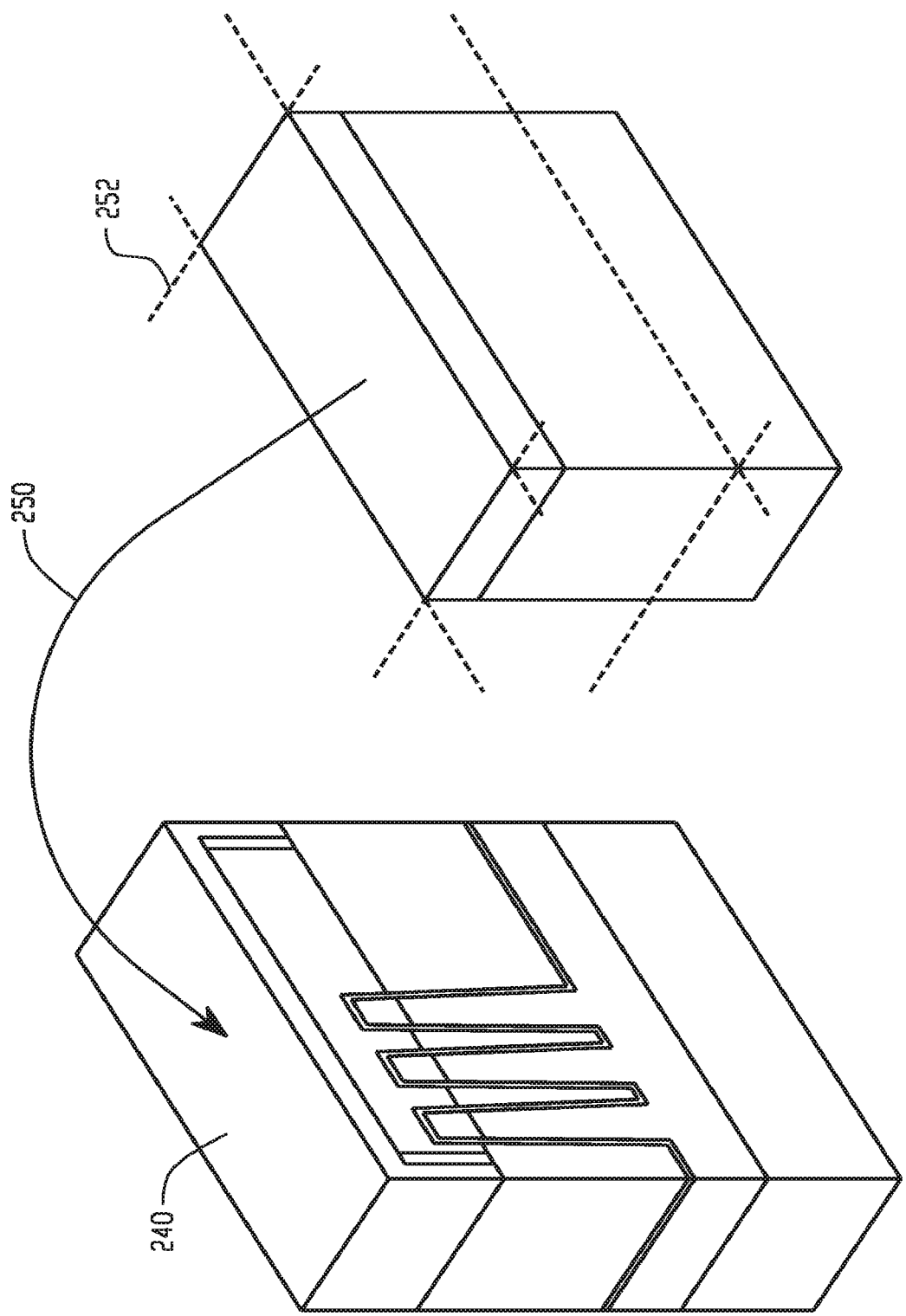

Referring back to FIG. 5, at operation 156, bonding the top surface of the buried oxide layer onto the top blanket surface takes place. FIG. 22 provides an illustration using an arrow 250 of bonding the top surface 252 of the buried oxide layer 244 to the top blanket surface 240 of the first transistor level. The two bonding surfaces 240, 250 should be planarized to minimize the surface roughness and the surfaces cleaned to remove particles before bonding.

Figure 23:
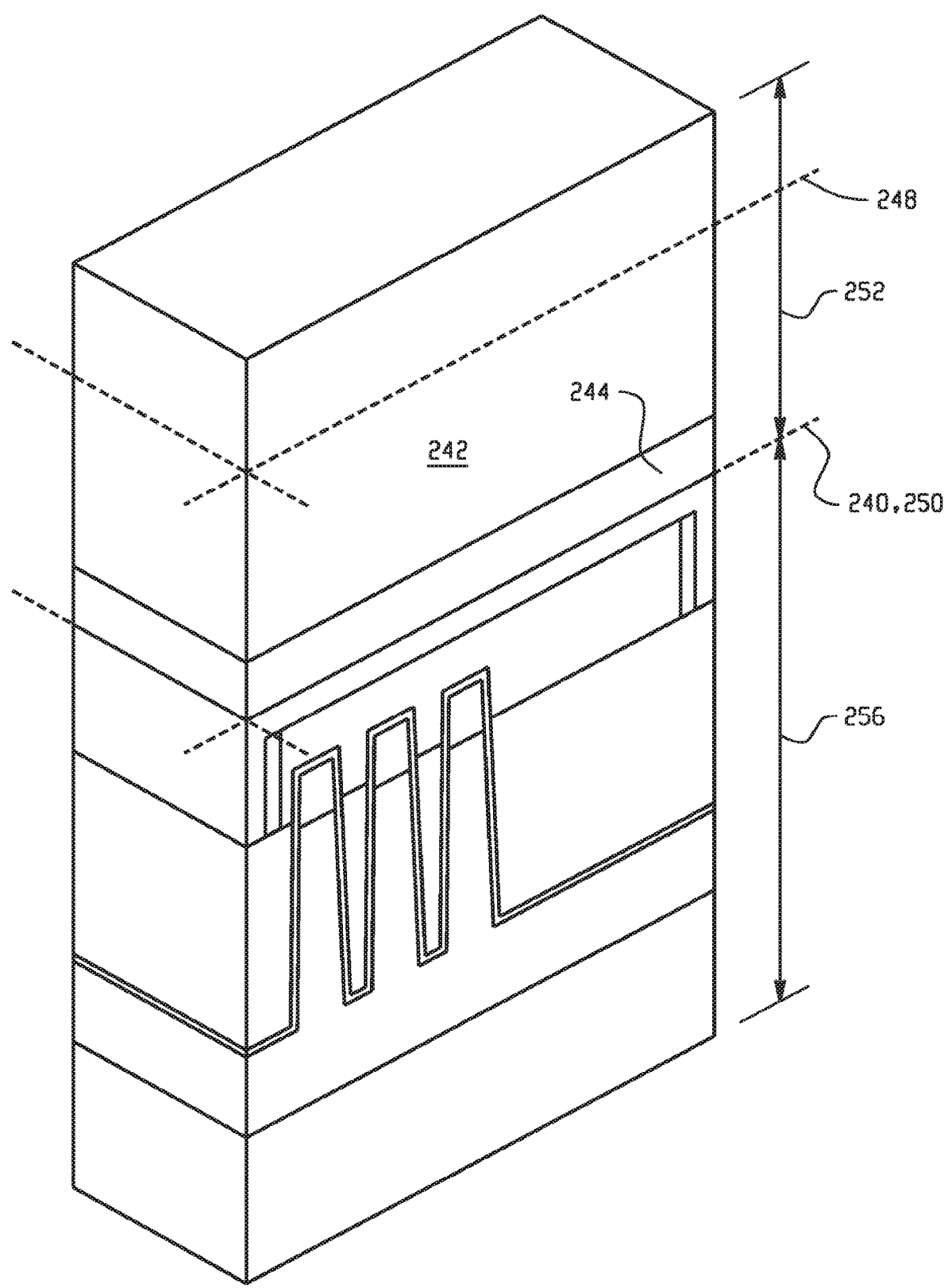

Referring back to FIG. 5, bonding the bottom insulator surface of a SOI substrate (or bond buried oxide and channel material) to the top blanket surface further comprises annealing operations to consolidate the bonding interface (operation 158). FIG. 23 depicts an isometric view of the semiconductor structure after annealing operations. Shown are substrate 242, buried oxide 244, and H2/He implantation layer level 248 in the bonding wafer 252, bonding surfaces 240, 250, and the wafer 256 of first transistor layer.

Figure 24:
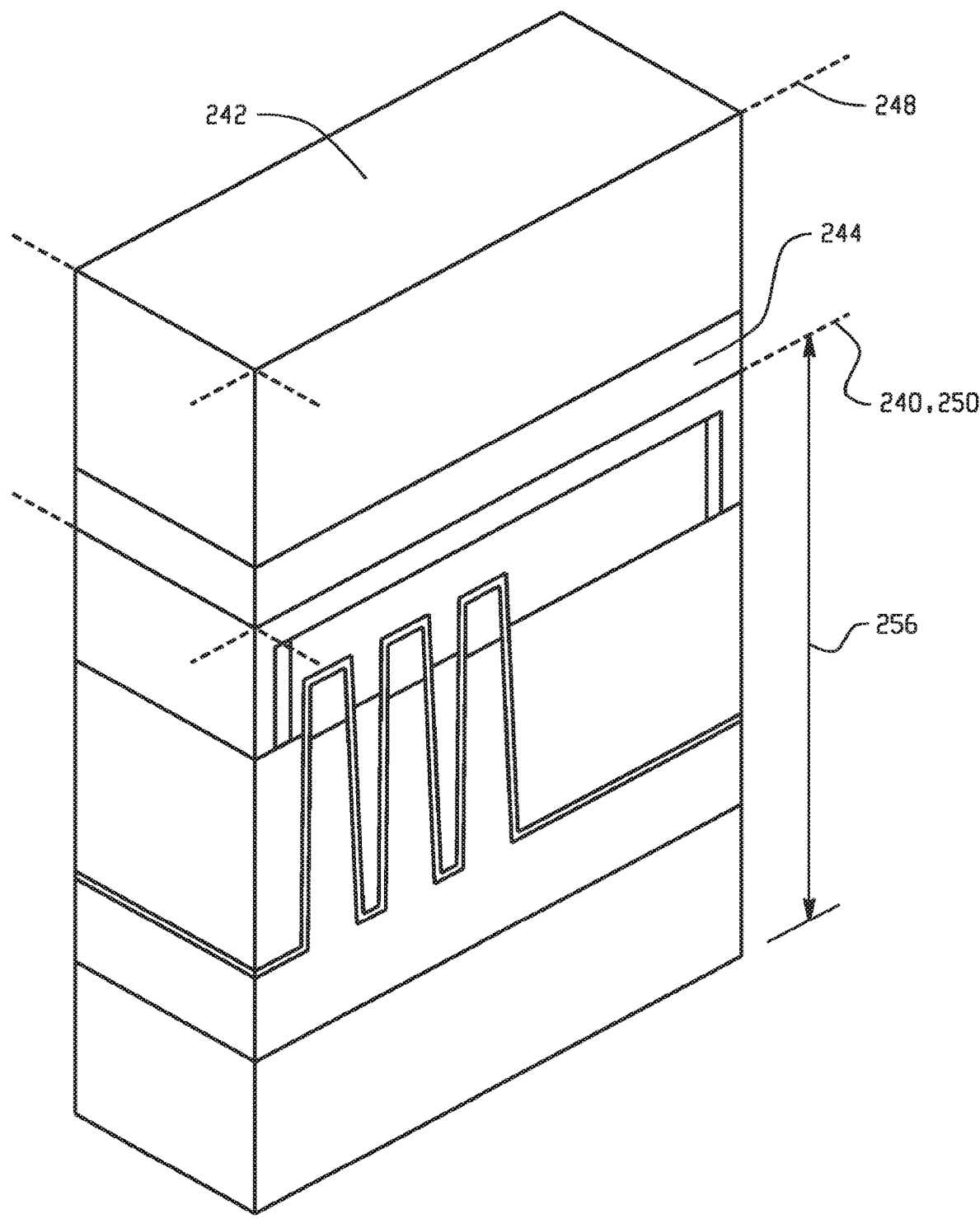

Referring back to FIG. 5, bonding the bottom insulator surface of a SOI substrate (or bond buried oxide and channel material) to the top blanket surface further comprises wafer cleaving (operation 160) at the H2/He implantation layer level. FIG. 24 depicts an isometric view of the semiconductor structure after wafer cleaving operations. The substrate 242 has been cleaved at the H2/He implantation layer level 248.

Figure 25B:
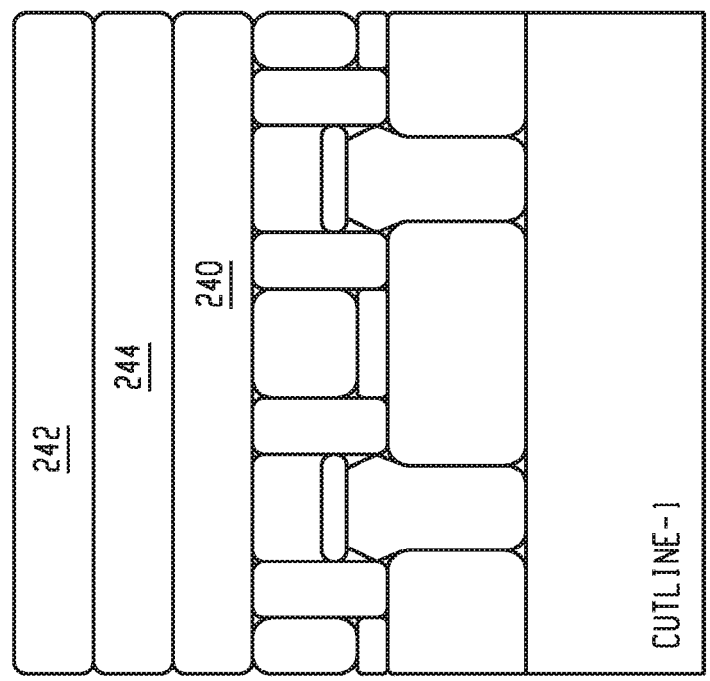
Figure 25A:
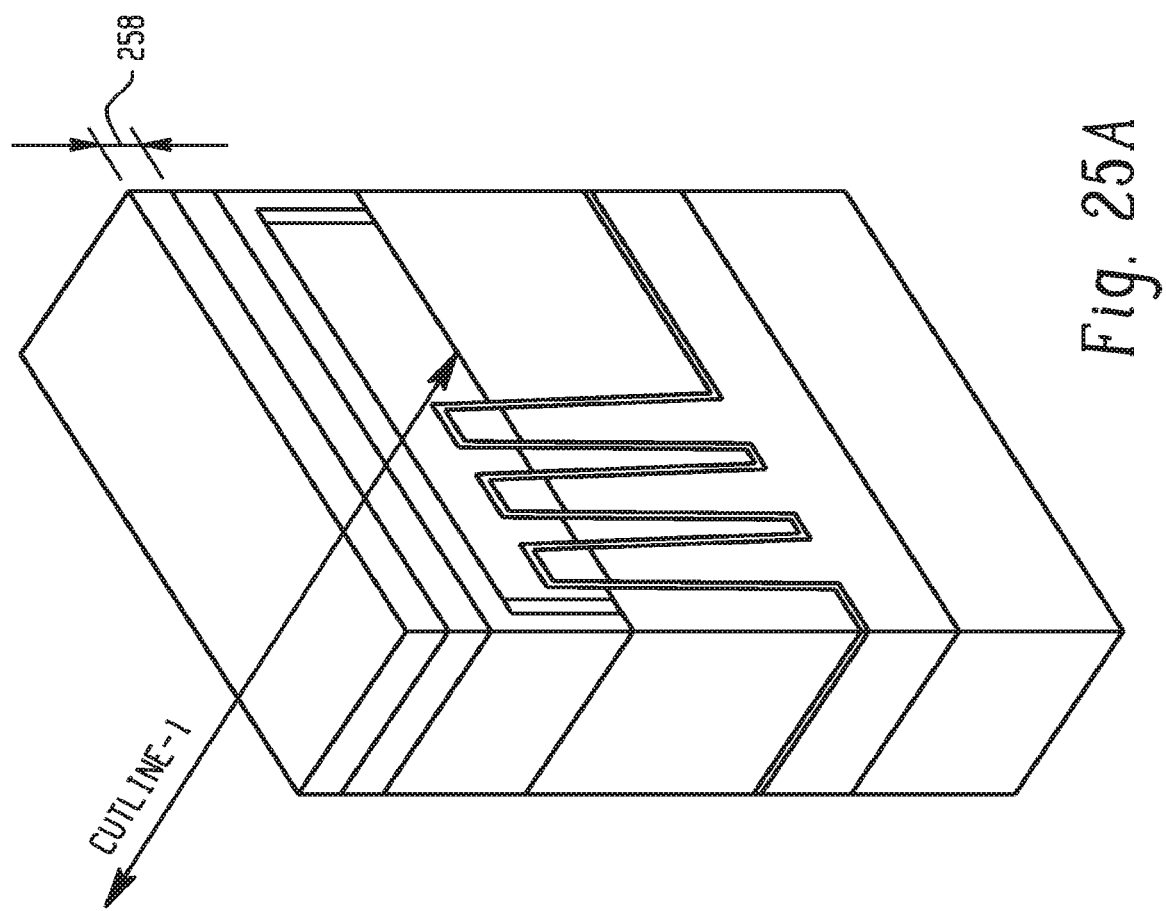

Referring back to FIG. 5, bonding the bottom insulator surface of a SOI substrate (or bond buried oxide and channel material) to the top blanket surface further comprises GaAs CMP (operation 162) to reduce the size of the GaAs substrate. FIG. 25A depicts an isometric view of the semiconductor structure after GaAs CMP. FIG. 25B provides a cross-sectional view of the semiconductor structure from cutline 1 of FIG. 25A. CMP for the GaAs channel material is undertaken to get the second channel material to a targeted thickness 258.

Figure 6:
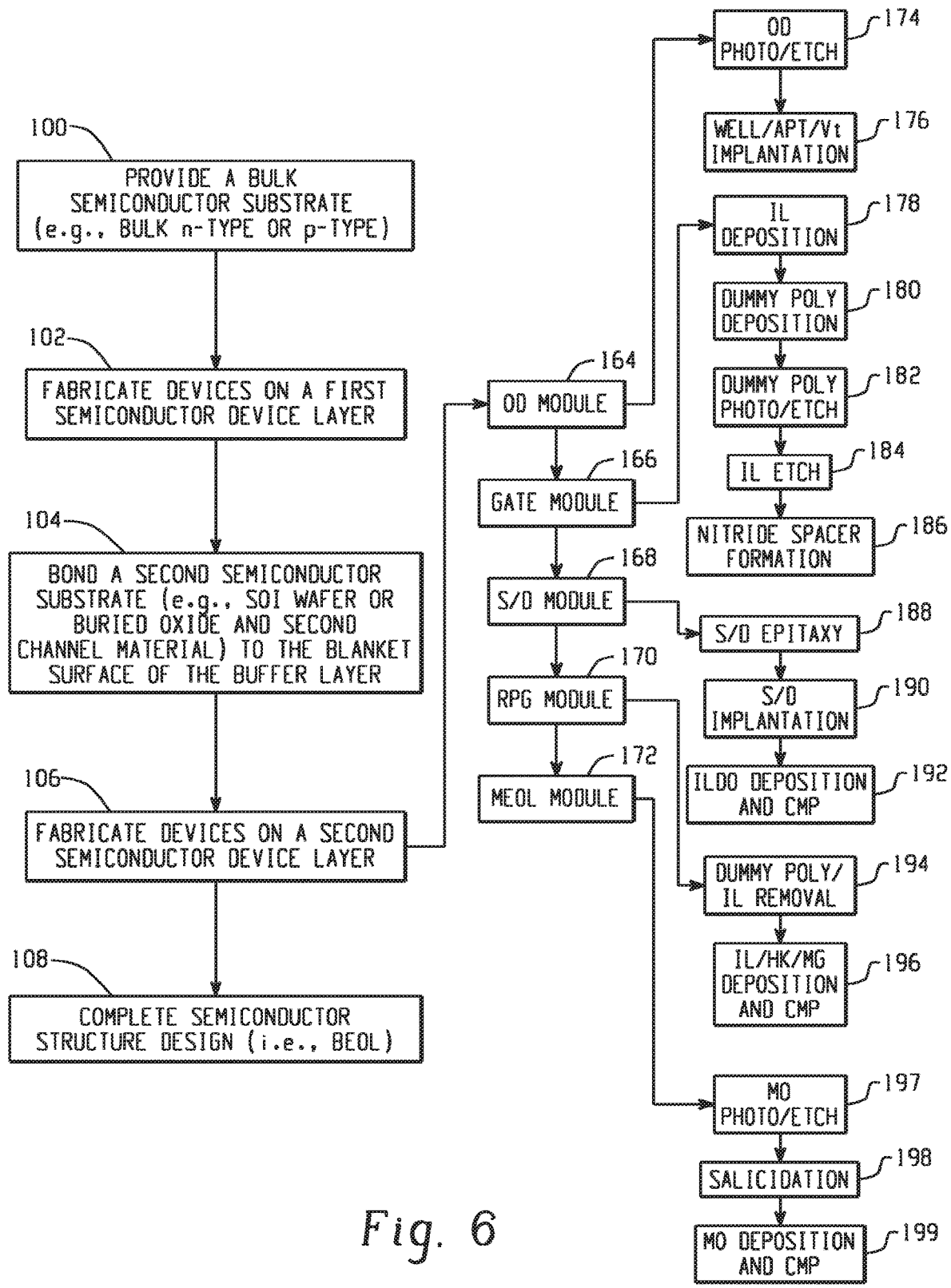

FIG. 6 is a process flow chart depicting another example method for creating a multi-layer semiconductor structure having two semiconductor device layers. This example method involves providing a bulk substrate for a first semiconductor device layer (operation 100), fabricating the first semiconductor layer with a blanket top surface on a buffer layer (operation 102), bonding the bottom insulator surface of a SOI substrate (or bond buried oxide and channel material) to the top blanket surface of the buffer layer (operation 104), fabricating the second device layer on the SOI substrate (operation 106), and completing the semiconductor structure with wiring and metallization layers (operation 108). The example method of FIG. 6 is similar to the example method of FIG. 2, but provides specific examples regarding how specific examples regarding the second semiconductor layer may be fabricated.

In particular, fabrication of devices in the second semiconductor device layer, in this example, involves an oxidation ("OD") module process (operation 164), a gate module process (operation 166), a source/drain module process (operation 168), a remove poly gate module process (operation 170), and a middle end of line ("MEOL") module process (operation 172).

The OD module process (operation 164) may involve a number of iterations of isolation oxide deposition and planarizing, photolithography and etching operations (operation 174), and diffusion/ion implantation operations (operation 176) such as P-well or N-well implantation, P+ implantation, and N+ implantation.

The gate module process (operation 166) may involve operations such as depositing isolation oxide material (operation 178), dummy poly deposition (operation 180), dummy poly photolithography/etching (operation 182), etching isolation oxide material (operation 184), and nitride spacer formation (operation 186).

The source/drain module process (operation 168), may involve source/drain epitaxial growth operations (operation 188), source/drain implantation operations (operation 190), and interlayer dielectric deposition and etching (operation 192).

The remove poly gate module process (operation 170) may involve dummy poly/isolation oxide removal (operation 194) and isolation oxide/high K/metal gate deposition and CMP (operation 196).

The middle end of line ("MEOL") module process (operation 172), may involve M0 photolithography and etching operations (operation 197), salicidation (operation 198), and M0 deposition and CMP (operation 199).

Figure 26B:
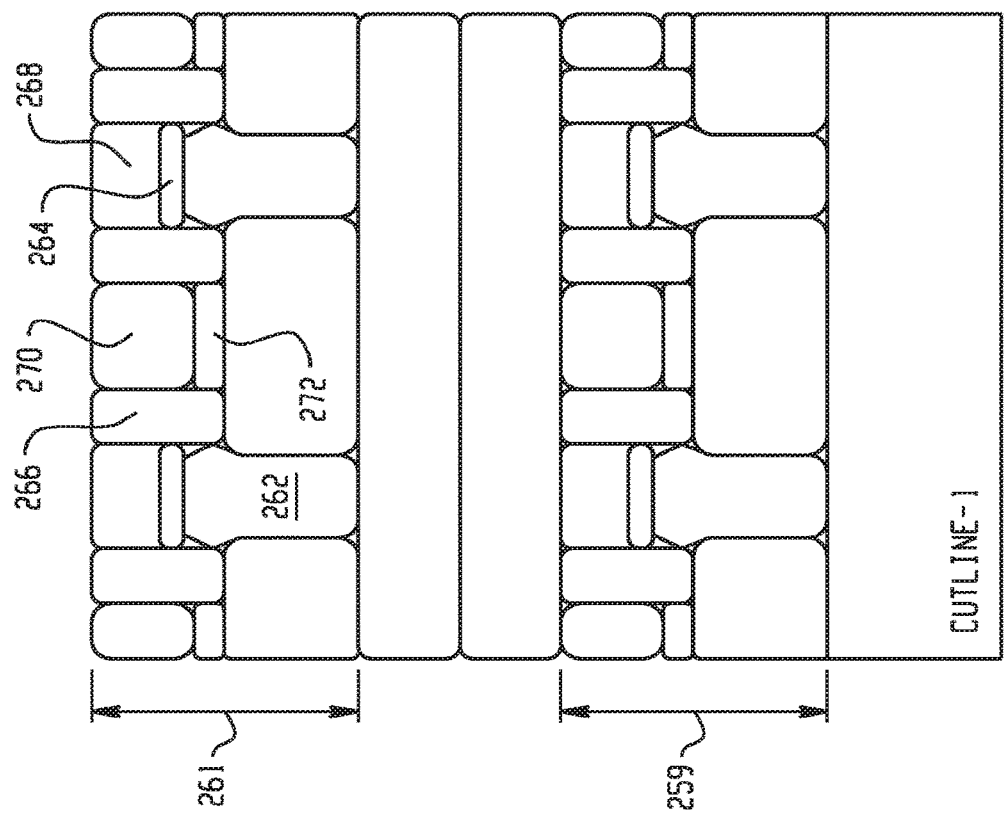
Figure 26A:
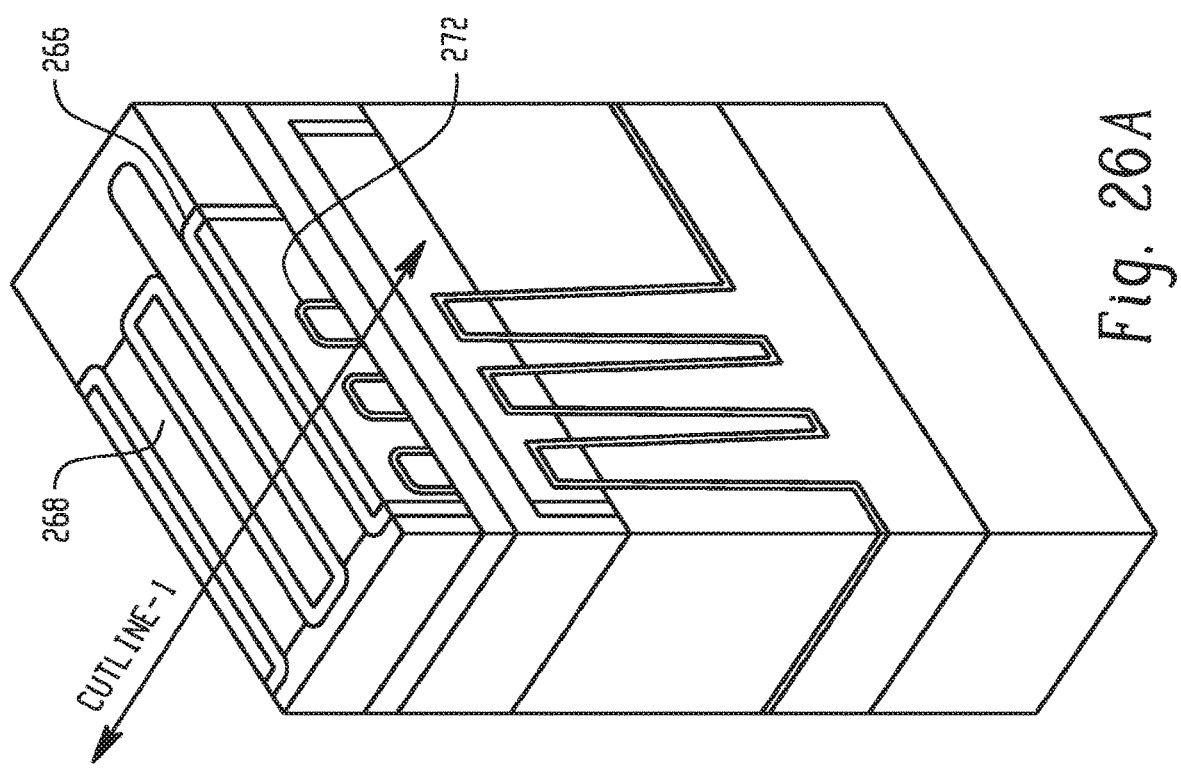

FIG. 26A depicts an isometric view of the semiconductor structure after fabrication of devices in the second semiconductor device layer. FIG. 26B provides a cross-sectional view of the semiconductor structure from cutline 1 of FIG. 26A. These figures show the silicon substrate 216, the first semiconductor device (or transistor) layer 259, the buffer layer 240, the buried oxide layer 244, and the second semiconductor device (or transistor) layer 261. The second transistor layer 261 comprises N+ source/drain regions 262, silicide 264, nitride spacers 266, M0 metal 268, metal gate 270, and IL/HK 272.

Figure 27B:
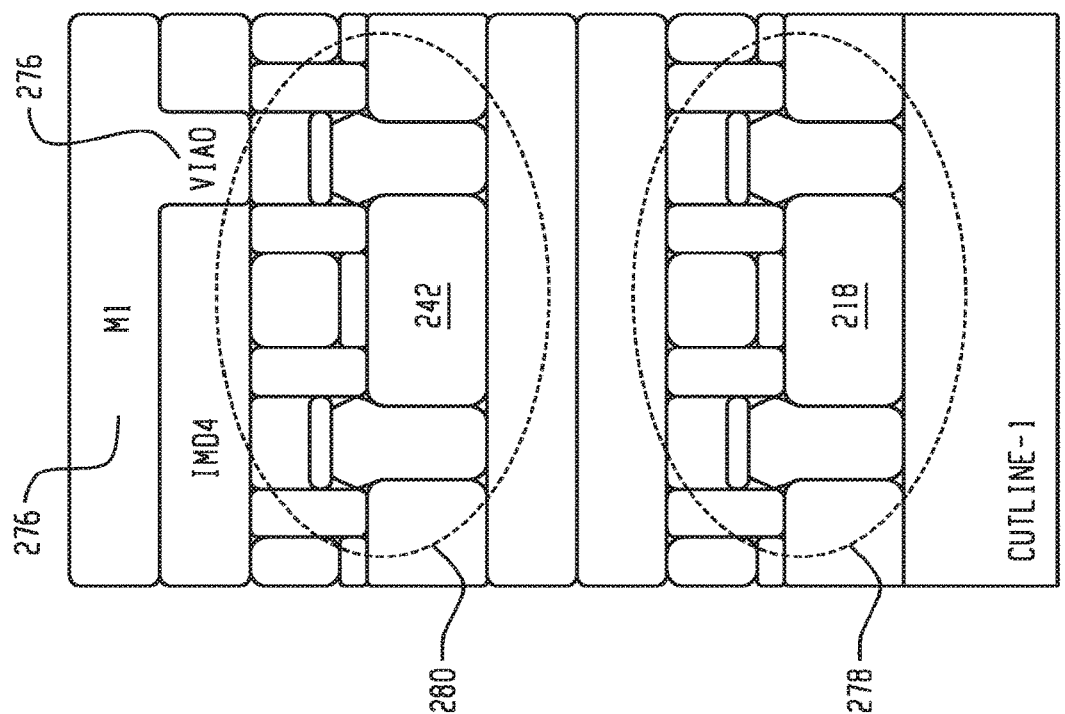
Figure 27A:
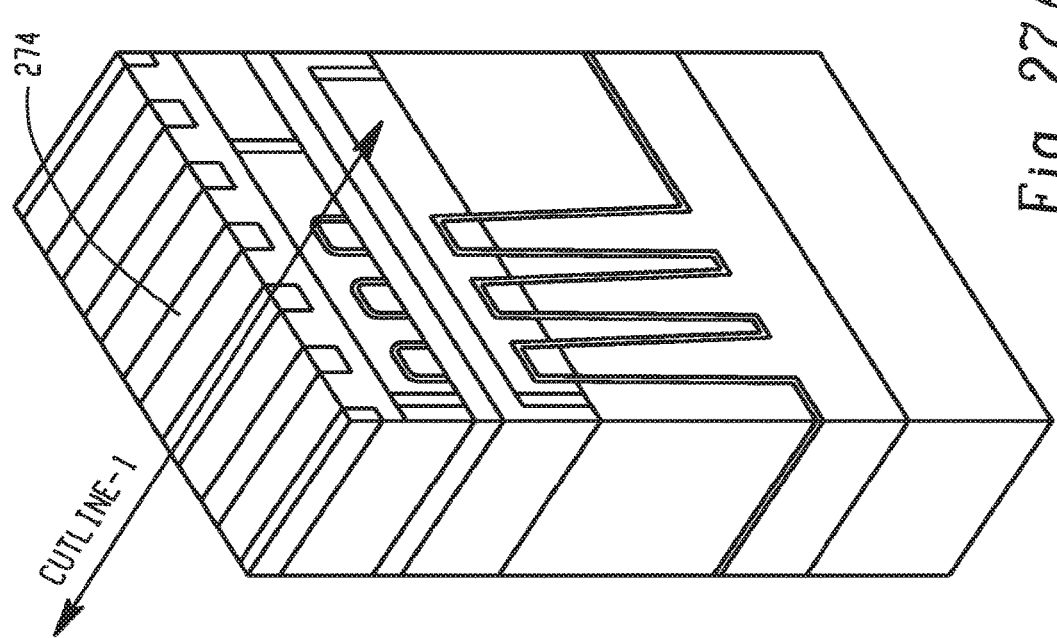

After the second semiconductor device layer is fabricated, BEOL operations may take place. FIG. 27A depicts an isometric view of the semiconductor structure after the BEOL operations (e.g., operation 108 of FIG. 6), including the addition of a M1 metal 274, are complete. FIG. 27B provides a cross-sectional view of the semiconductor structure from cutline 1 of FIG. 27A and also shows via0 276 from the M1 metal 274 to the M0 metal 268 of the second transistor level. Identified by oval 278 is the first transistor fabricated on a bulk structure, and identified by oval 280 is the second transistor fabricated on a SOI structure. The first channel material 218 is formed by epitaxy on the silicon substrate with strain.

Figure 28:
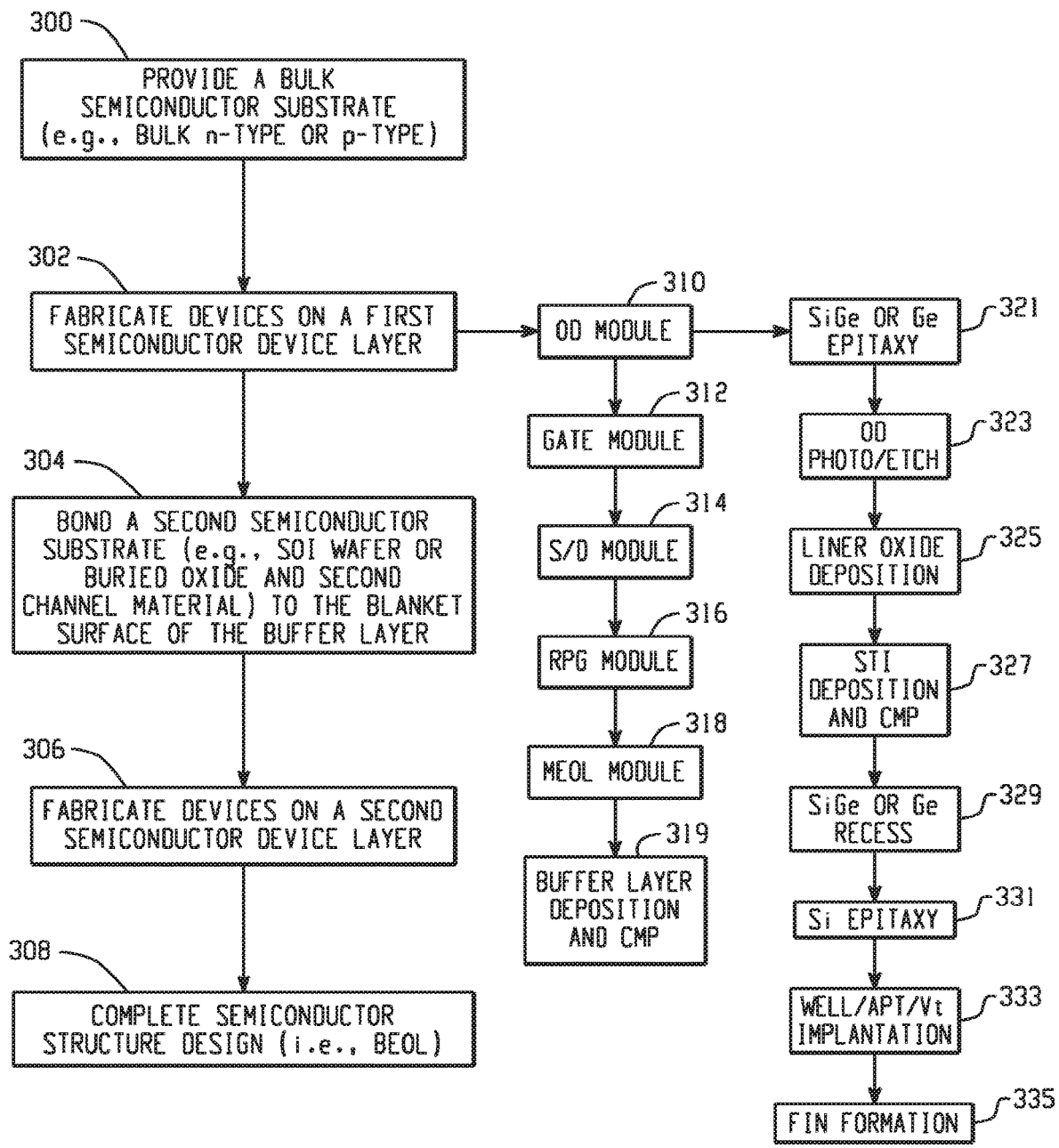
FIGS. 28-31 are process flow charts depicting example methods for generating a semiconductor structure having multiple transistor (or semiconductor) layers.

FIG. 28 is a process flow chart depicting another example method for creating a multi-layer semiconductor structure having two semiconductor device layers. This example method involves providing a bulk substrate for a first semiconductor device layer (operation 300), fabricating the first semiconductor layer with a blanket top surface on a buffer layer (operation 302), bonding the bottom insulator surface of a SOI substrate (or bond buried oxide and channel material) to the top blanket surface of the buffer layer (operation 304), fabricating the second device layer on the SOI substrate (operation 306), and completing the semiconductor structure with wiring and metallization layers (operation 308).

In particular, fabrication of devices in the first semiconductor device layer, in this example, involves an oxidation ("OD") module process (operation 310), a gate module process (operation 312), a source/drain module process (operation 314), a remove poly gate module process (operation 316), a middle end of line ("MEOL") module process (operation 318), and a buffer layer deposition and CMP process (operation 319).

Figure 32:
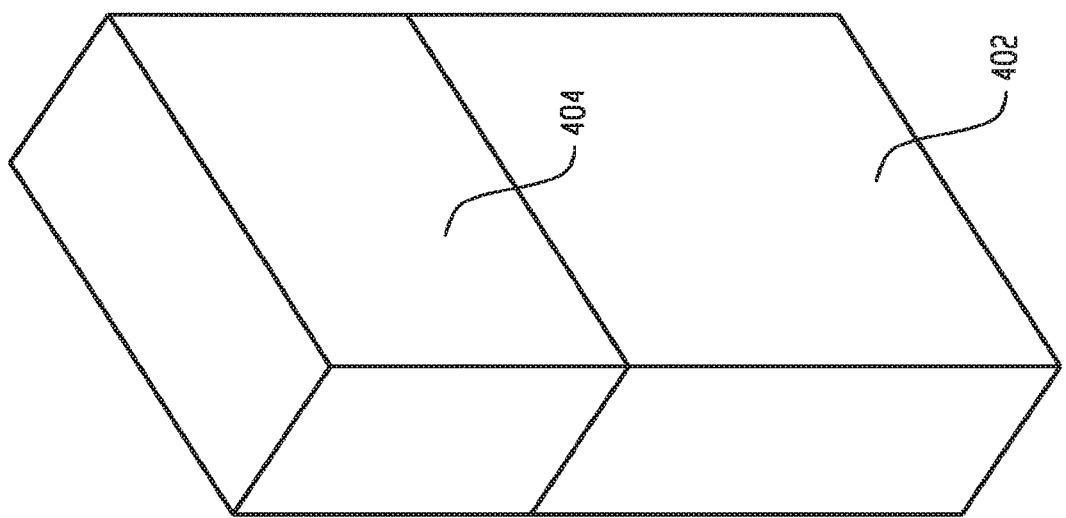

The OD module process (operation 310) for forming a NMOS transistor on the bulk wafer may comprise SiGe or Ge epitaxy (operation 321). FIG. 32 depicts an isometric view of an example bulk wafer 400 with SiGe or Ge epitaxy 404 above a silicon substrate 402. Sufficient thickness of the Ge or SiGe epitaxy may ensure that the Ge or SiGe crystal is fully relaxed and does not suffer the stress of the Si substrate. In this example, the thickness may be 400 nm~500 nm.

Figure 33:
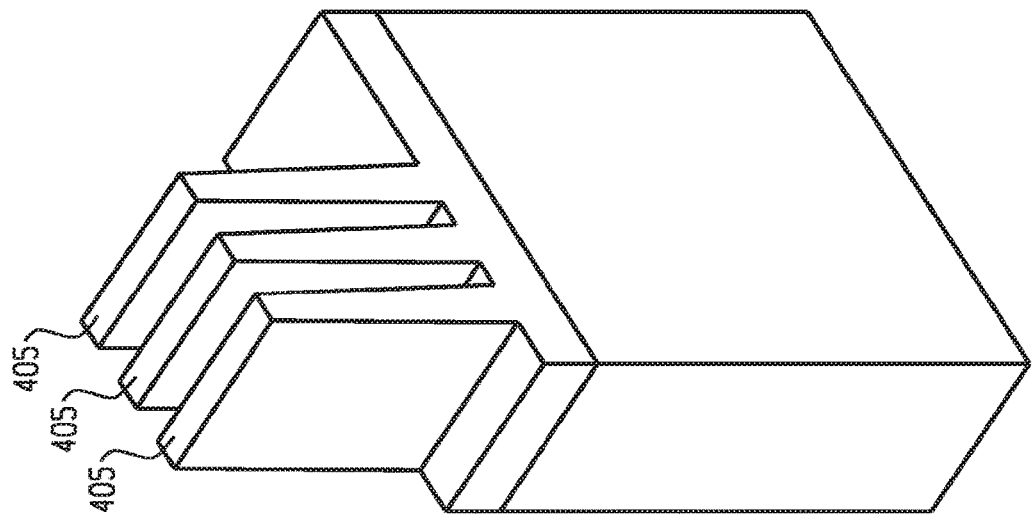

Referring back to FIG. 28, the OD module process (operation 310) may further comprise a number of iterations of photolithography and etching operations (operation 323). The photolithography and etching operations may result in substrate material being removed from certain regions of the bulk substrate. FIG. 33 depicts an isometric view of a portion of the semiconductor structure after completion of the photolithography and etching operations (operation 320 of FIG. 28). Shown are OD fins 405 on the bulk substrate 402 for a NMOS transistor.

Figure 34:
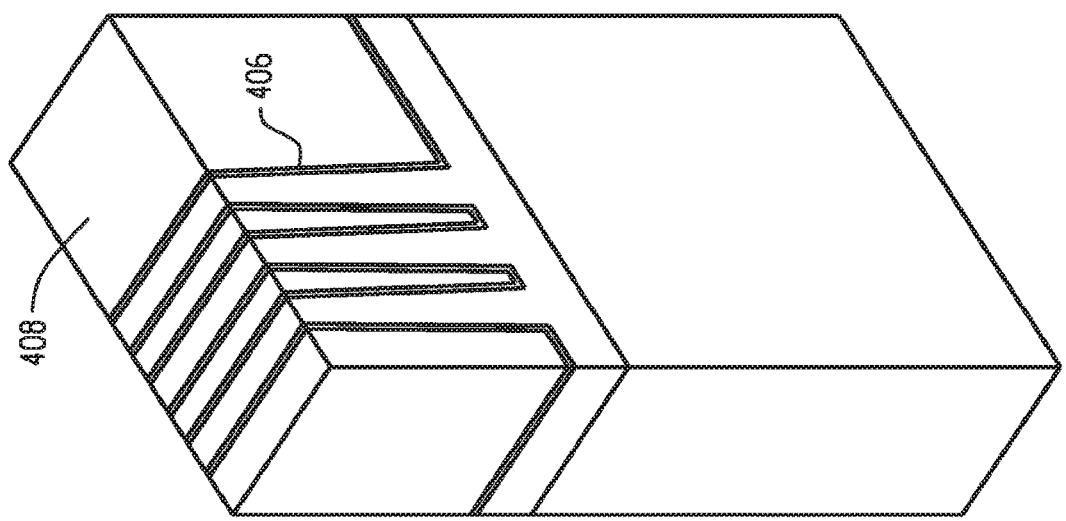

Referring back to FIG. 28, the OD module process (operation 310) may further comprise liner oxide deposition (operation 325) and shallow trench isolation ("STI") deposition and CMP (operation 327). The liner oxide deposition and STI deposition and CMP may result in liner oxide and STI being deposited within the regions vacated during the photo-lithography and etching operations (operation 323). FIG. 34 depicts an isometric view of a portion of the semiconductor structure after completion of liner oxide deposition (operation 325 of FIG. 28) and STI deposition and CMP (operation 327 of FIG. 28). Shown are the deposited liner oxide 406 and the deposited STI material 408.

Figure 35:
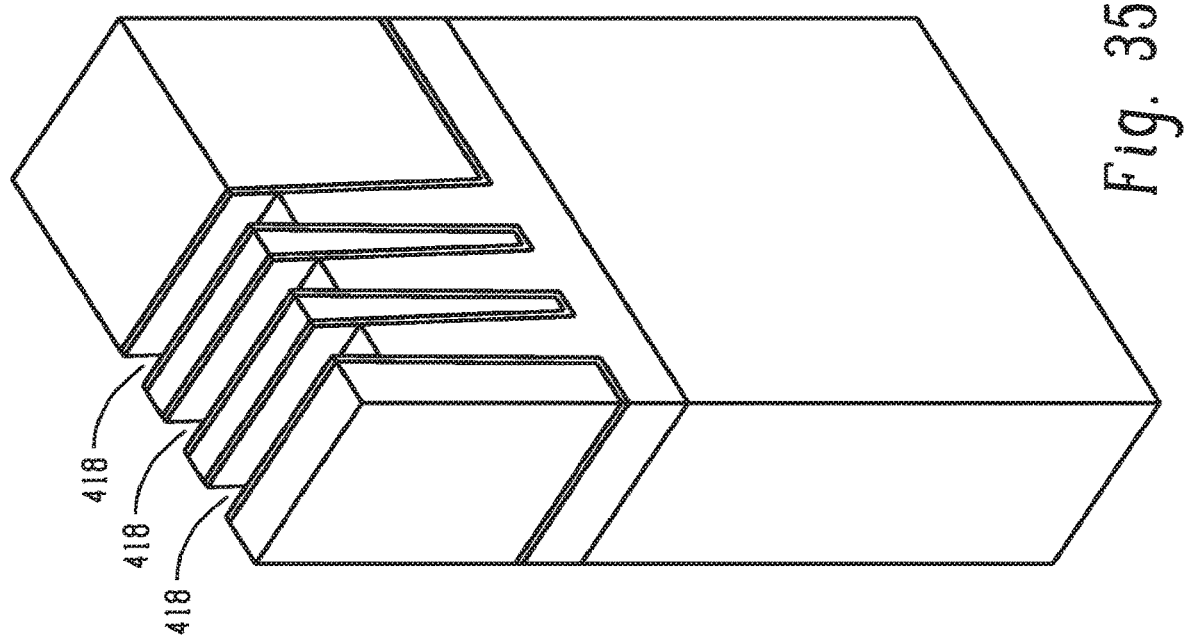

Referring back to FIG. 28, the OD module process (operation 310) may further comprise SiGe or Ge recess formation (operation 329). FIG. 35 depicts an isometric view of a portion of the semiconductor structure after completion of SiGe or Ge recess formation (operation 326 of FIG. 28). Shown are formed recesses 410.

Figure 36:
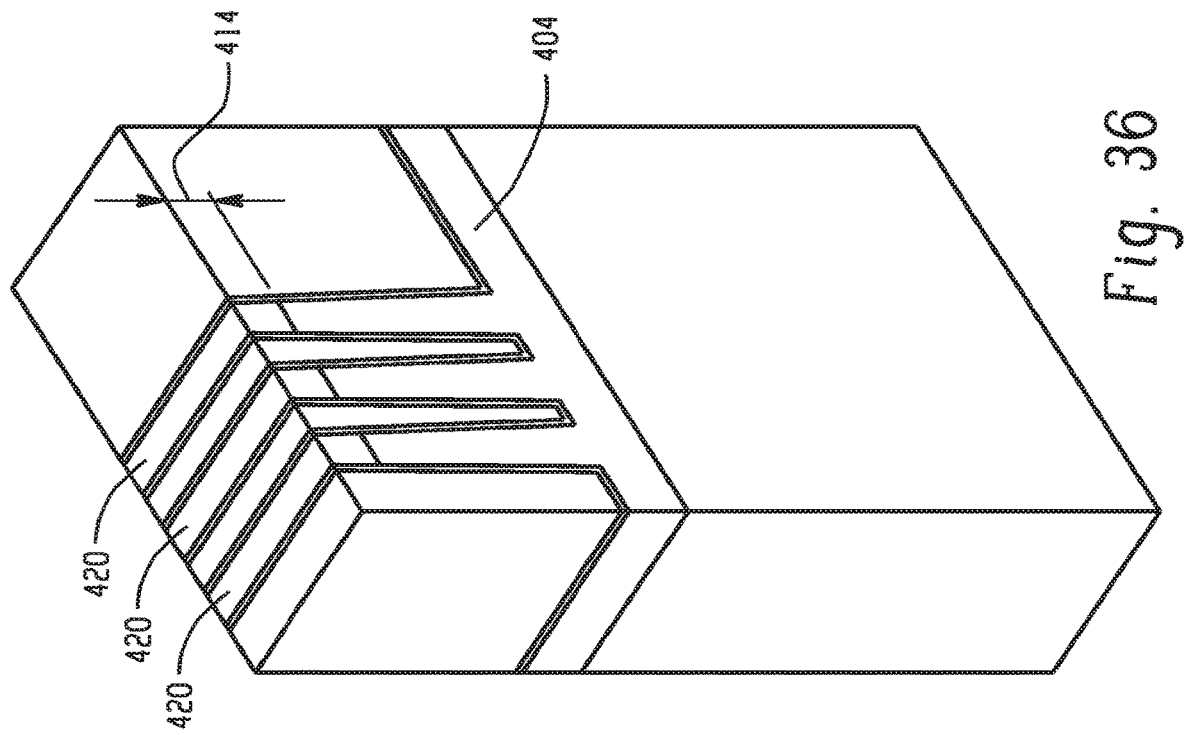

Referring back to FIG. 28, the OD module process (operation 310) may further comprise Ge or SiGe epitaxy and CMP (operation 331). FIG. 36 depicts an isometric view of a portion of the semiconductor structure after completion of Si epitaxy and CMP (operation 331 of FIG. 28) in the former SiGe or Ge recesses. Shown is the epitaxial grown Si 412. The Si epitaxy 412 will align the lattice of Ge or SiGe substrate 404. The intrinsic lattice constant of Si is smaller than that of Ge or SiGe. Therefore, the channel material will experience a tensile strain. In this example, the thickness 414 of the Si epitaxy is about 10 nm~30 nm and the strain may be relaxed with larger epitaxy depth.

Referring back to FIG. 28, the OD module process (operation 310) may further comprise well implantation (operation 333); and fin formation (operation 335). FIG. 37 depicts an isometric view of a portion of the semiconductor structure after completion of fin formation (operation 335 of FIG. 28). Shown are fins 420 with P-well implantation after removal of STI material 408.

Figure 29:
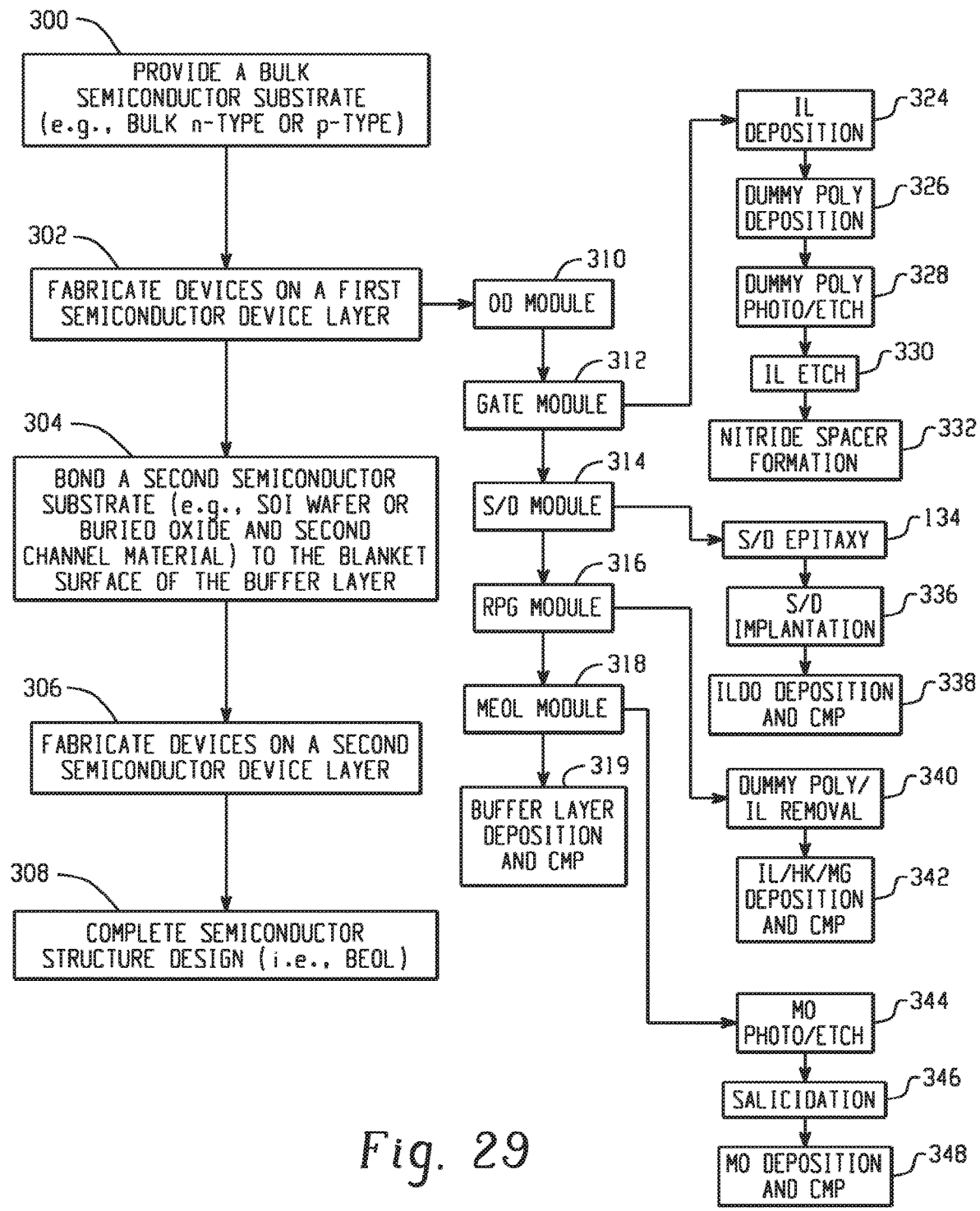

FIG. 29 is a process flow chart depicting another example method for creating a multi-layer semiconductor structure having two semiconductor device layers. This example method involves providing a bulk substrate for a first semiconductor device layer (operation 300), fabricating the first semiconductor layer with a blanket top surface on a buffer layer (operation 302), bonding the bottom insulator surface of a SOI substrate (or bond buried oxide and channel material) to the top blanket surface of the buffer layer (operation 304), fabricating the second device layer on the SOI substrate (operation 306), and completing the semiconductor structure with wiring and metallization layers (operation 308). The example method of FIG. 29 is similar to the example method of FIG. 28, but provides additional specific examples regarding how the first semiconductor layer may be fabricated.

In particular, fabrication of devices in the first semiconductor device layer, in this example, involves an oxidation ("OD") module process (operation 310), a gate module process (operation 312), a source/drain module process (operation 314), a remove poly gate module process (operation 316), a middle end of line ("MEOL") module process (operation 318), and a buffer layer deposition and CMP process (operation 319).

The gate module process (operation 312), may comprise operations such as depositing isolation oxide material (operation 324), dummy poly deposition (operation 326), dummy poly photolithography/etching (operation 328), etching isolation oxide material (operation 330), and nitride spacer formation (operation 332).

The source/drain module process (operation 314) may involve source/drain epitaxial growth operations (operation 334), source/drain implantation operations (operation 336), and interlayer dielectric deposition and CMP (operation 338).

The remove poly gate module process (operation 316) involves dummy poly/isolation oxide removal (operation 340) and isolation oxide/high K/metal gate deposition and CMP (operation 342).

The MEOL module process (operation 318) may involve M0 photolithography and etching operations (operation 344), salicidation (operation 346), and M0 deposition and CMP (operation 348). FIG. 38A depicts an isometric view of a portion of the semiconductor structure after the MEOL module process (operation 318 of FIG. 29). FIG. 38B provides a cross-sectional view of the semiconductor structure from cutline 1 of FIG. 38A. These figures show the addition of M0 metal material 434 and silicide 436, the nitride spacer 424, the first gate 432, the silicide 436, and the n– source/drain regions 428.

Referring back to FIG. 29, the buffer layer deposition and CMP process (operation 319) results in a glue/buffer layer being deposited onto the top surface of the first transistor layer to produce a uniform, non-patterned, no topography and homogeneous surface for wafer bonding. In this example, a feasible thickness for this layer is about 10 nm~20 nm to eliminate the stress induced by subsequent wafer bonding.

Figure 39B:
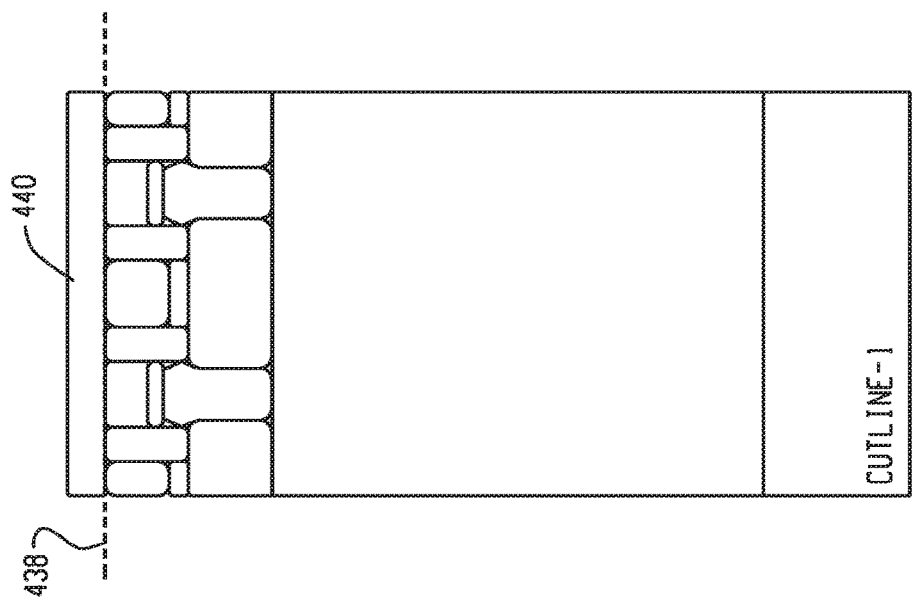
Figure 39A:
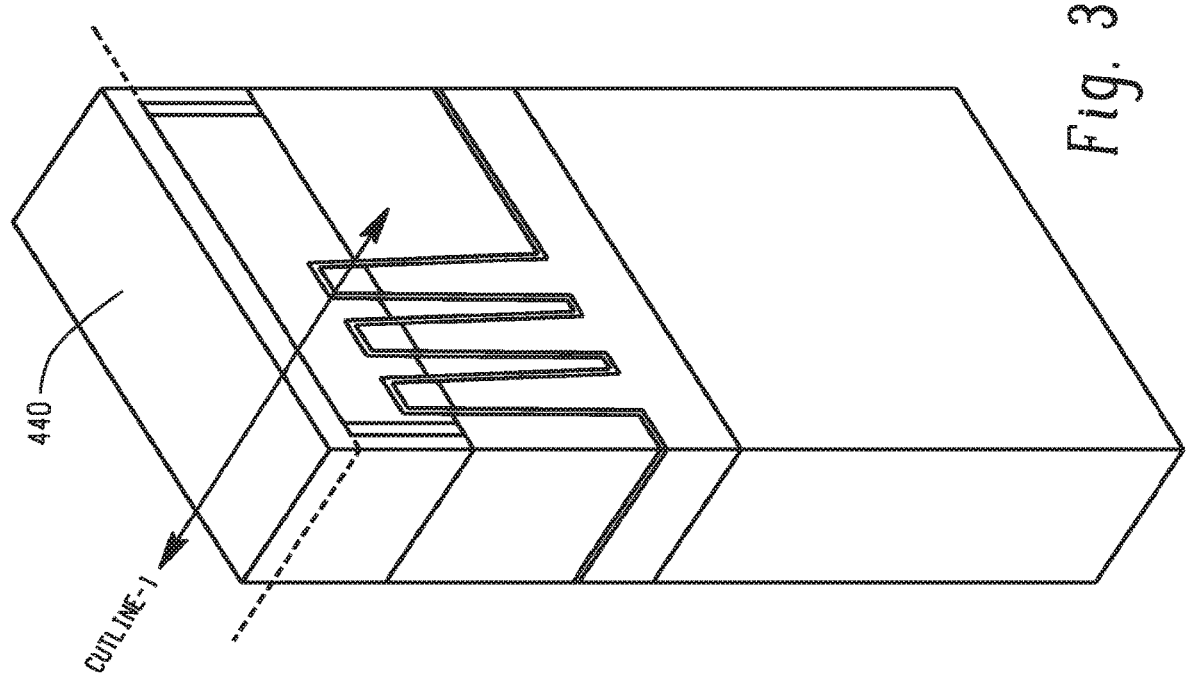

FIG. 39A depicts an isometric view of a portion of the semiconductor structure after the buffer layer deposition and CMP process (operation 319 of FIG. 29). FIG. 39B provides a cross-sectional view of the semiconductor structure from cutline 1 of FIG. 39A. These figures show the glue/buffer layer 440 deposited on top surface 438 of the first transistor layer.

Figure 30:
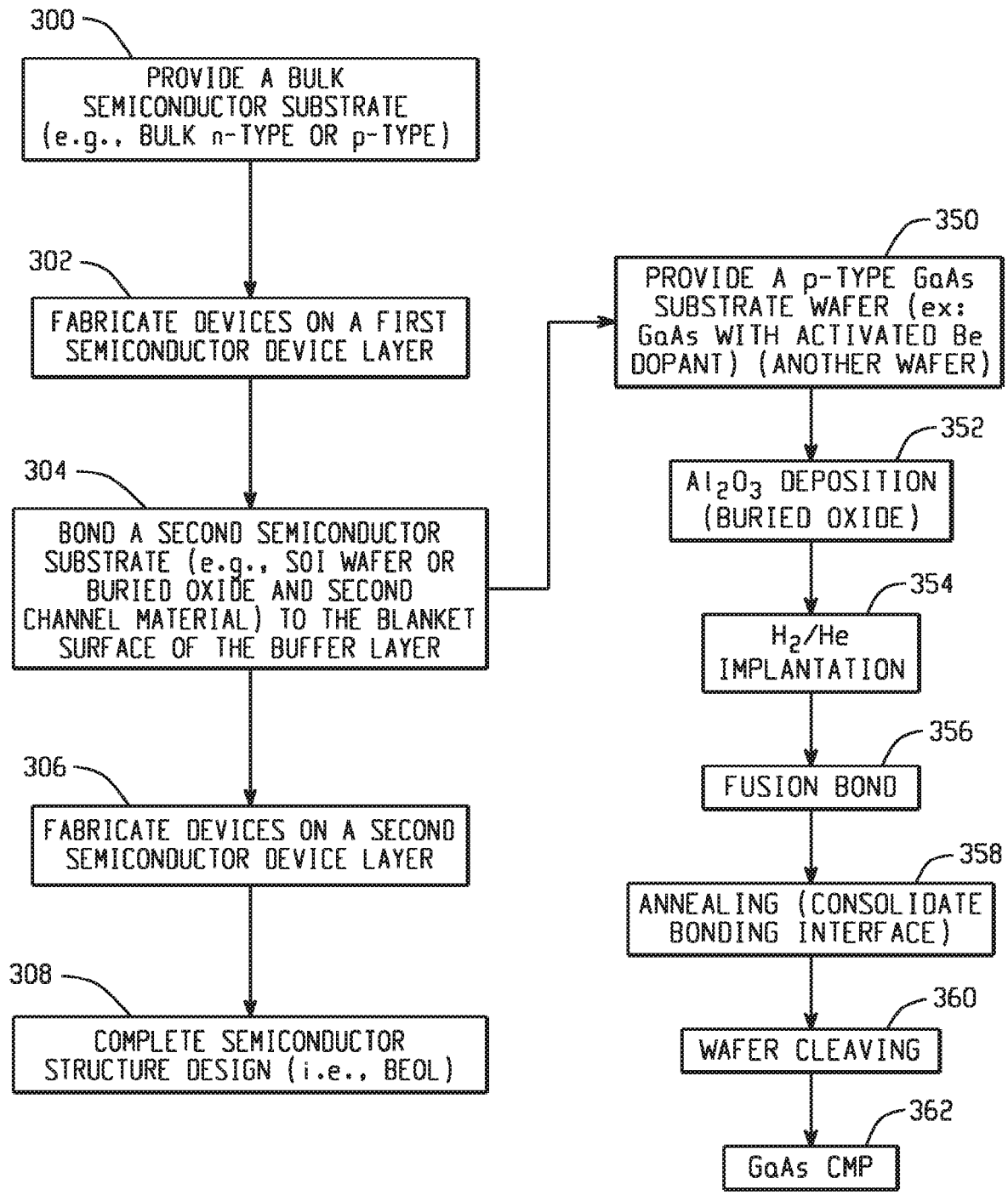

FIG. 30 is a process flow chart depicting another example method for creating a multi-layer semiconductor structure having two semiconductor device layers. This example method involves providing a bulk substrate for a first semiconductor device layer (operation 300), fabricating the first semiconductor layer with a blanket top surface on a buffer layer (operation 302), bonding the bottom insulator surface of a SOI substrate (or bond buried oxide and channel material) to the top blanket surface of the buffer layer (operation 304), fabricating the second device layer on the SOI substrate (operation 306), and completing the semiconductor structure with wiring and metallization layers (operation 308). The example method of FIG. 30 is similar to the example method of FIG. 28, but provides specific examples regarding how the second semiconductor substrate may be bonded to the surface of the first semiconductor device.

Figure 40B:
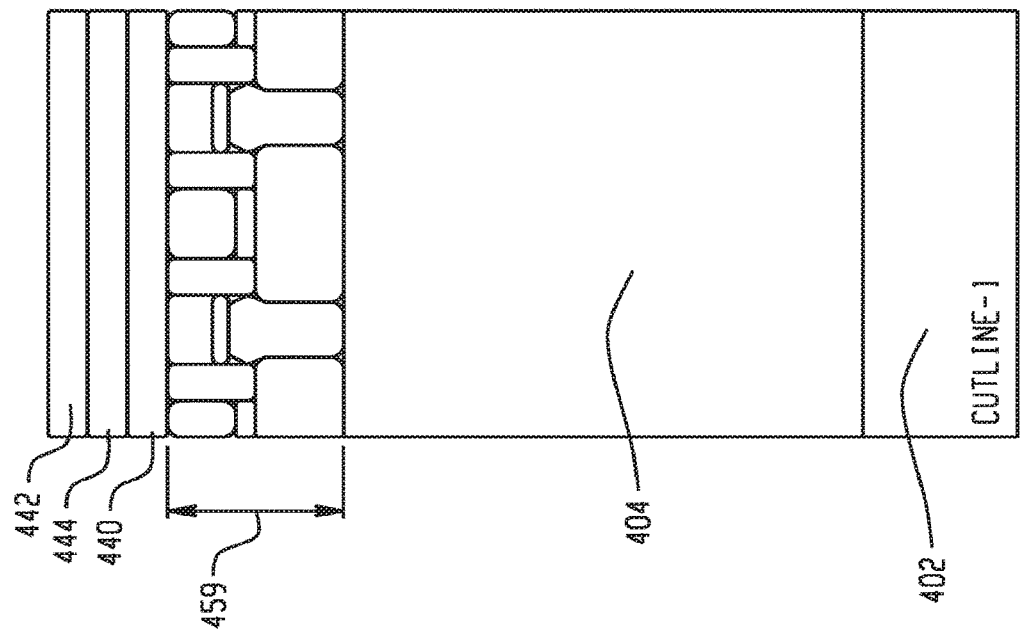
Figure 40A:
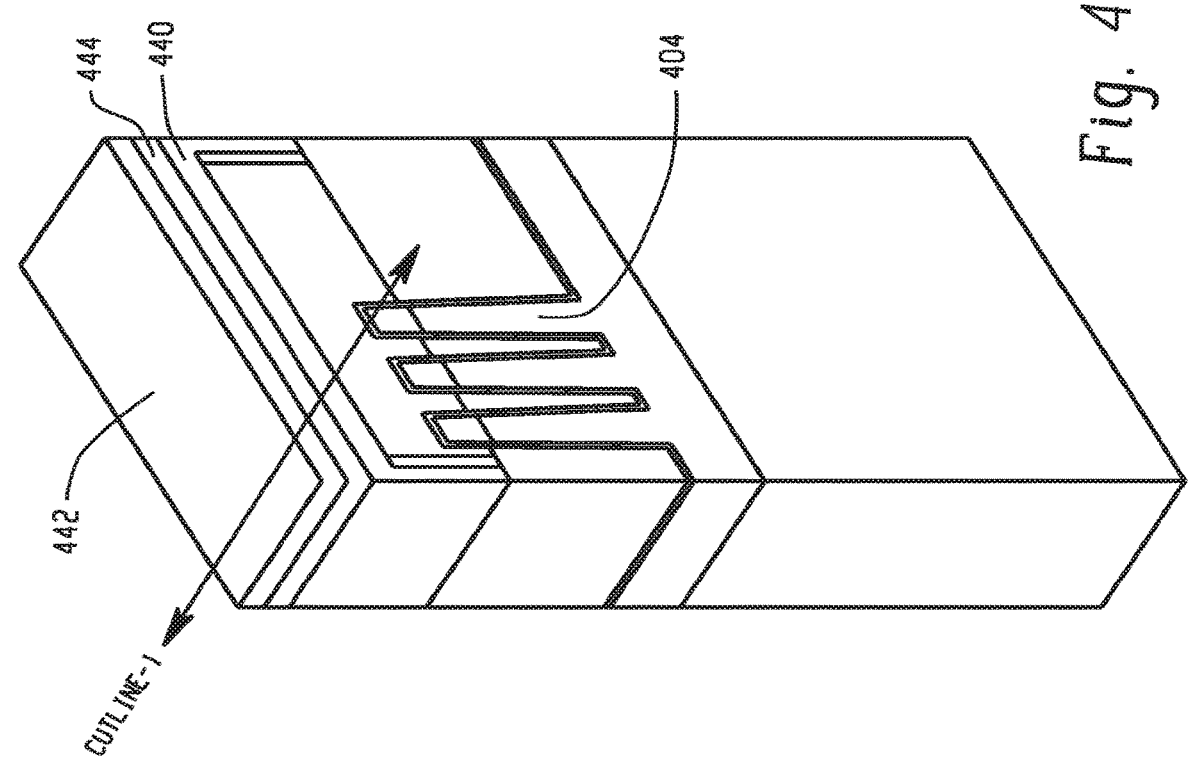

In particular, referring to FIG. 30, bonding the bottom insulator surface of a SOI substrate (or bond buried oxide and channel material) to the top blanket surface, in this example, comprises providing a separate substrate (operation 350), such as GaAs with an activated Be dopant; depositing a defect free buried oxide layer (operation 352) onto the substrate; $H_2$/He implantation (operation 354); at operation 356, bonding the top surface of the buried oxide layer onto the top blanket surface; annealing operations to consolidate the bonding interface (operation 358); wafer cleaving (operation 360); and GaAs CMP (operation 362) to reduce the size of the GaAs substrate. FIG. 40A depicts an isometric view of the semiconductor structure after GaAs CMP. FIG. 40B provides a cross-sectional view of the semiconductor structure from cutline 1 of FIG. 40A. These figures show SiGe or Ge epitaxy 404 above a silicon substrate 402, the first semiconductor device (or transistor) layer 459, the buffer layer 440, the buried oxide layer 444, and the second channel 442.

Figure 31:
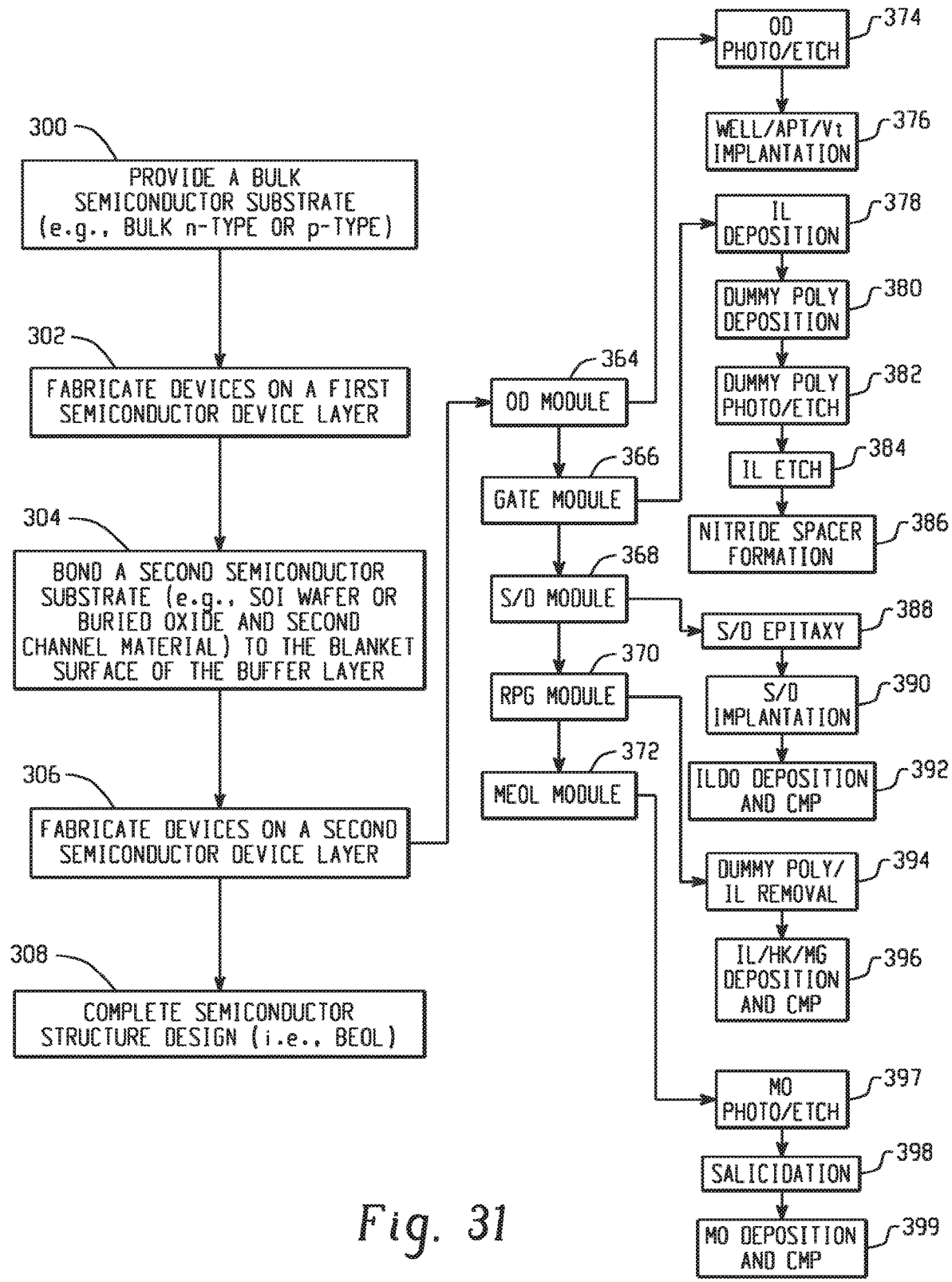

FIG. 31 is a process flow chart depicting another example method for creating a multi-layer semiconductor structure having two semiconductor device layers. This example method involves providing a bulk substrate for a first semiconductor device layer (operation 300), fabricating the first semiconductor layer with a blanket top surface on a buffer layer (operation 302), bonding the bottom insulator surface of a SOI substrate (or bond buried oxide and channel material) to the top blanket surface of the buffer layer (operation 304), fabricating the second device layer on the SOI substrate (operation 306), and completing the semiconductor structure with wiring and metallization layers (operation 308). The example method of FIG. 31 is similar to the example method of FIG. 28, but provides specific examples regarding how specific examples regarding the second semiconductor layer may be fabricated.

In particular, fabrication of devices in the second semiconductor device layer, in this example, involves an oxidation ("OD") module process (operation 364), a gate module process (operation 366), a source/drain module process (operation 368), a remove poly gate module process (operation 370), and a middle end of line ("MEOL") module process (operation 372).

The OD module process (operation 364) may involve a number of iterations of isolation oxide deposition and planarizing, photolithography and etching operations (operation 374), and diffusion/ion implantation operations (operation 376) such as P-well or N-well implantation, P+ implantation, and N+ implantation.

The gate module process (operation 366) involves operations such as depositing isolation oxide material (operation 378), dummy poly deposition (operation 380), dummy poly photolithography/etching (operation 382), etching isolation oxide material (operation 384), and nitride spacer formation (operation 386).

The source/drain module process (operation 368), may involve source/drain epitaxial growth operations (operation 388), source/drain implantation operations (operation 390), and interlayer dielectric deposition and etching (operation 392).

The remove poly gate module process (operation 370) involves dummy poly/isolation oxide removal (operation 394) and isolation oxide/high K/metal gate deposition and CMP (operation 396).

The middle end of line ("MEOL") module process (operation 372), may involve M0 photolithography and etching operations (operation 397), salicidation (operation 398), and M0 deposition and CMP (operation 399).

Figure 41B:
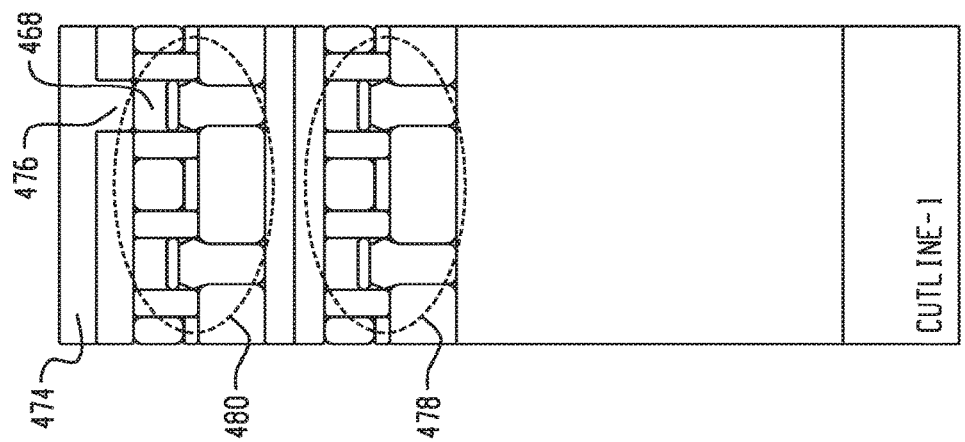
Figure 41A:
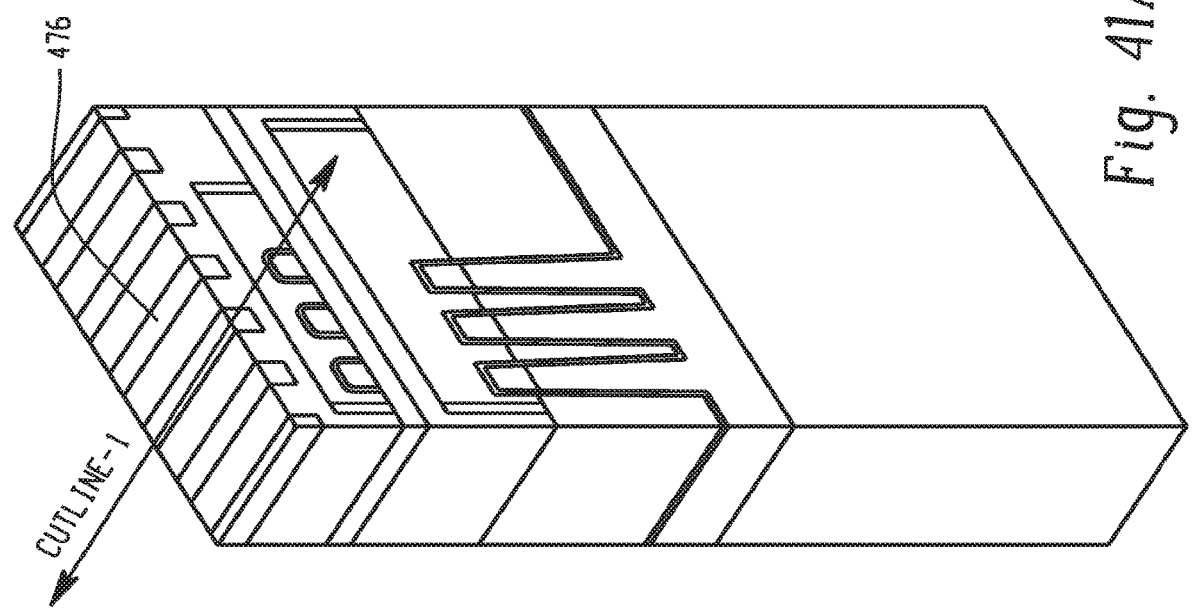

After the second semiconductor device layer is fabricated, BEOL operations may take place. FIG. 41A depicts an isometric view of the semiconductor structure after the BEOL operations (e.g., operation 308 of FIG. 31), including the addition of a M1 metal 464, are complete. FIG. 41B provides a cross-sectional view of the semiconductor structure from cutline 1 of FIG. 41A and also shows via0 476 from the M1 metal 474 to the M0 metal 468 of the second transistor level. Identified by oval 478 is the first transistor fabricated on a bulk structure, and identified by oval 480 is the second transistor fabricated on a SOI structure.

This written description uses examples to disclose the invention, includes the best mode, and also to enable a person skilled in the art to make and use the invention. The patentable scope of the invention may include other examples that occur to those skilled in the art. For example, a semiconductor structure could comprise three or more semiconductor device levels wherein the first semiconductor device level includes a bulk substrate and the second, third or more levels also include a SOI substrate. In another example, a semiconductor structure with multiple semiconductor device levels could include one level containing PMOS devices and another level containing NMOS devices.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:
1. A semiconductor structure comprising:
a bulk substrate;
a first semiconductor device layer over the bulk substrate, the first semiconductor device layer comprising a first channel material, the first channel material having a first type of strain, wherein the bulk substrate is a silicon (Si) substrate, and the first channel material is an epitaxial material comprising germanium (Ge) or silicon germanium (SiGe);
a buffer layer over the first semiconductor device layer, the buffer layer comprising a dielectric material;
a buried oxide layer over the buffer layer; and
a second semiconductor device layer over the buried oxide layer, the second semiconductor device layer comprising a second channel material.

2. The semiconductor structure of claim 1, wherein the second channel material has a second type of strain different form the first type of strain.

3. The semiconductor structure of claim 1, wherein the first semiconductor device layer comprises a first transistor, and the second semiconductor device layer comprises a second transistor.

4. The semiconductor structure of claim 3, wherein the first transistor is an N-type transistor, and the second transistor is a P-type transistor.

5. The semiconductor structure of claim 1, wherein the buffer layer has a thickness between about 10 nm and about 20 nm.

6. The semiconductor structure of claim 5, wherein the buffer layer has a compressive stress no greater than about $2\times10^9$ dynes/cm$^2$.

7. The semiconductor structure of claim 5, wherein the buffer layer has a tensile stress no greater than about $1\times10^9$ dynes/cm$^2$.

8. The semiconductor structure of claim 1, wherein the first channel material is a first epitaxial material, wherein the semiconductor structure further comprises a second epitaxial material between the bulk substrate and the first channel material, the second epitaxial material being different from the first epitaxial material.

9. The semiconductor structure of claim 8, wherein the first epitaxial material comprises germanium (Ge) or silicon germanium (SiGe), and the second epitaxial material comprises silicon (Si).

10. A semiconductor structure comprising:
a first semiconductor device layer comprising a first transistor, a first material of a channel region of the first transistor is germanium or silicon germanium;
a second semiconductor device layer over the first semiconductor device layer, the second semiconductor device layer comprising a second transistor, a second material of a channel region of the second transistor is silicon;
a buried oxide layer between the first semiconductor device layer and the second semiconductor device layer; and
a buffer layer between the buried oxide layer and the first semiconductor device layer.

11. The semiconductor structure of claim 10, wherein the buffer layer has a tensile stress no greater than about $1\times10^9$ dynes/cm$^2$.

12. The semiconductor structure of claim 10, wherein the buffer layer has a compressive stress no greater than about $2\times10^9$ dynes/cm$^2$.

13. The semiconductor structure of claim 10, wherein a first side of the buried oxide layer is directly bonded to the second semiconductor device layer, and a second side of the buried oxide layer opposing the first side is directly bonded to the buffer layer.

14. The semiconductor structure of claim 10, wherein the first semiconductor device layer comprises a first channel material with a first type of strain, and the second semiconductor device layer comprises a second channel material with a second type of strain different from the first type of strain.

15. The semiconductor structure of claim 14, wherein the first type of strain is tensile strain, and the second type of strain is compressive strain.

16. A semiconductor structure comprising:
a first Fin Field-Transistor (FinFET) in a first device layer, a first fin of the first FinFET comprising a lower portion and an upper portion over the lower portion, wherein the lower portion is disposed between isolations regions of the first FinFET and comprises a first semiconductor material, wherein the upper portion protrudes above the isolation regions and comprises a second semiconductor material different from the first semiconductor material, wherein the second semiconductor material is a first channel material of the first FinFET, the first channel material having a first type of strain;
a buffer layer over the first device layer;
a buried oxide layer over the buffer layer; and
a second FinFET in a second device layer over the buried oxide layer, a second fin of the second FinFET comprising a third semiconductor material that extends continuously from a bottommost surface of the second fin to an uppermost surface of the second fin, wherein the third semiconductor material is different from the first semiconductor material and the second semiconductor material, wherein the third semiconductor material is a second channel material of the second FinFET, the second channel material having a second type of strain different from the first type of strain.

17. The semiconductor structure of claim 16, wherein the first type of strain is tensile strain, and the second type of strain is compressive strain.

18. The semiconductor structure of claim 16, wherein the first FinFET is a PMOS device, and the second FinFET is an NMOS device.

19. The semiconductor structure of claim 16, wherein the first semiconductor material is silicon, the second semiconductor material is germanium or silicon germanium, and the third semiconductor material is gallium arsenide.

20. The semiconductor structure of claim 16, wherein the buffer layer has a compressive stress no greater than about $2\times10^9$ dynes/cm$^2$.

* * * * *